US006791526B2

(12) United States Patent
Kubota et al.

(10) Patent No.: US 6,791,526 B2
(45) Date of Patent: Sep. 14, 2004

(54) DRIVE CIRCUIT

(75) Inventors: Yasushi Kubota, Ibaraki (JP); Tatsumi Satoh, Oita (JP)

(73) Assignee: Texas Instruments Incorporated, Dallas, TX (US)

( * ) Notice: Subject to any disclaimer, the term of this patent is extended or adjusted under 35 U.S.C. 154(b) by 276 days.

(21) Appl. No.: 10/097,784

(22) Filed: Mar. 13, 2002

(65) Prior Publication Data

US 2002/0130852 A1 Sep. 19, 2002

(30) Foreign Application Priority Data

Mar. 14, 2001 (JP) ...................................... 2001-073161

(51) Int. Cl.[7] ........................... G09G 3/36; G09G 5/00; G11C 19/00

(52) U.S. Cl. ......................... 345/100; 345/210; 377/69; 365/81

(58) Field of Search ............................. 345/87, 94, 95, 345/98, 99, 100, 204, 208, 210; 377/64, 69, 72, 75, 76; 365/78, 80, 81, 82, 85, 189.12, 240

(56) References Cited

U.S. PATENT DOCUMENTS 5,523,772 A * 6/1996 Lee ............................ 345/98
5,534,885 A * 7/1996 Saitoh ........................ 345/100
5,990,857 A * 11/1999 Kubota et al. ................ 345/98
6,166,725 A * 12/2000 Isami et al. ................. 345/209
6,529,181 B2 * 3/2003 Nakano et al. ............... 345/98
6,630,920 B1 * 10/2003 Maekawa et al. ........... 345/100

* cited by examiner

*Primary Examiner*—Bipin Shalwala
*Assistant Examiner*—Jeff Piziali
(74) *Attorney, Agent, or Firm*—Wiliam B. Kempler; W. James Brady, III; Frederick J. Telecky, Jr.

(57) ABSTRACT

A drive circuit, for example a gate line drive circuit for a TFT liquid-crystal display, having a circuit size smaller than in the past. A TFT drive circuit has the shifting direction of drive data sequentially shifted through shift registers (SR116–R60) and is further inverted by a control signal (SEL_SFT), and the data are shifted in the opposite direction, from the first shift register (SR61) to the second shift register (SR116). At this time, the upper group of switching circuits (SW1–SW56) or the lower group of switching circuits (SW116–SW61) is enabled and the other group is disabled by control signals (SEL_UP, SEL_LO). Once the drive data are shifted to the bits of the shift registers, a voltage selection signal generated by a decoder (DEn) is inputted to an output circuit via an effective switching circuit, and a drive signal for a TFT gate is outputted. The number of circuits is reduced because the shift registers (SR61–SR116) and decoders (DE61–DE116) are shared by two outputs.

5 Claims, 19 Drawing Sheets

DRIVE CIRCUIT

FIELD OF THE INVENTION

The present invention relates to a drive voltage designed to sequentially energize a plurality of output lines, and more particularly to a drive voltage designed to sequentially energize the gate lines of a TFT liquid-crystal display.

BACKGROUND OF THE INVENTION

FIG. 14 is a schematic block diagram depicting a common TFT (Thin Film Transistor) liquid-crystal display.

In FIG. 14, 1 is a TFT, 2 a liquid crystal, 3 a gate drive circuit, 4 a data drive circuit, and 5 a timing control circuit.

Pixel cells composed of TFTs 1 and liquid crystals 2 are arranged in a matrix at intersections between the gate lines of the gate drive circuits 3 and the data lines of the data drive circuits 4, as shown in FIG. 14.

As a switch for controlling the voltage applied to the liquid crystal of each pixel cell, each TFT 1 is switched on or off depending on the gate line drive signal OUTk ($1 \leqq k \leqq n$) from the corresponding gate drive circuit 3. In an off-position, the liquid crystals and the data lines of the data drive circuits 4 are connected, and the voltage from the data lines is applied to the liquid crystals.

Each liquid crystal 2 is connected between a common terminal COM and the drain of a TFT 1 and is designed to vary light transmission in accordance with the voltage applied from the data line of the corresponding data drive circuit 4 via the TFT 1.

Each gate drive circuit 3 operates such that drive signals for sequentially energizing the gate lines connected to the TFT gates of each row of the pixel matrix are generated in accordance with the control signals from the timing control circuits 5. The TFTs of the pixel cells lying on the same line are switched on at the same time by the drive signals from the gate drive circuits 3.

The data drive circuits 4 are configured such that video signals Sc provided in synchronism with a horizontal sync signal are sequentially retained for each of the pixels of the pixel matrix in accordance with the control signals from the timing control circuits 5, and drive signals for energizing the data lines are generated in accordance with the video signals Sc of the pixels thus retained.

The timing control circuits 5 generate control signals whereby the video signals Sc of individual pixels are sequentially retained by the data drive circuits 4 on the basis of the horizontal or vertical sync signals of the video signals Sc. In addition, each gate drive circuit 3 generates a control signal for energizing the gate line with the timing (horizontal retrace periodicity) at which a video signal Sc corresponding to a single horizontal line is retained by the data drive circuit 4.

In a TFT liquid-crystal display thus configured, the video signals Sc presented to data drive circuits 4 are retained by each pixel of a horizontal line with a timing that corresponds to the control signals from the timing control circuits 5. The data lines corresponding to the pixels of the horizontal line are energized in accordance with the magnitude of the video signals Sc thus retained. Specific gate lines are energized with the timing that corresponds to the control signals from the timing control circuits 5, the TFTs of the pixel cells connected to these gate lines are switched on at the same time, and the drive voltage of each data line is applied to the liquid crystal. The applied voltage of each pixel cell is sequentially refreshed by repeating these operations for each horizontal line.

A conventional example of the gate drive circuit 3 shown in FIG. 14 will now be described.

FIG. 15 is a schematic block diagram illustrating an example of a conventional TFT gate drive circuit with three voltage levels. The circuit comprises 265 output channels designed to energize gate lines.

In FIG. 15, 6 is an input level shifting circuit, 8 a 265-bit bidirectional shift register circuit, 9 a decoding circuit, 10 an output level shifting circuit, and 11 an output buffer circuit.

The input level shifting circuit 6 allows the logic level of an input/output signal (between the power voltage VDD and the reference voltage VSS) to be shifted to the internal logic level of a gate drive circuit (between the power voltage VDL and the reference voltage VEE). Specifically, the levels of clock signals CPV, shift data STV1 and STV2, shift direction switching signals L/R, and other input/output signals are converted to the internal logic level of the gate drive circuit, and the input/output signals thus converted are presented to the bidirectional shift register 8 or decoding circuit 9.

The bidirectional shift register 8 operates such that the shift data STV1 (or shift data STV2) from the input level shifting circuit are sequentially shifted in synchronism with the clock signal CPV in the shifting direction that corresponds to the shift direction switching signals L/R. In addition, the shift data STV2 (or shift data STV1) shifted following the end bits of the shift register are sequentially presented to the input level shifting circuit 6.

The decoding circuit 9 generates three-bit data obtained by combining each bit of the bidirectional shift register 8 with the preceding and following bits, produces two-bit data for decoding shift direction switching signals L/R and selecting one of three voltage levels, and outputs the results to the output level shifting circuit 10 associated with the corresponding bits.

The output level shifting circuit 10 is a circuit whereby the signal level of the two-bit data obtained from the decoding circuit 9 is shifted to the high-voltage input signal level of the output buffer circuit 11. For example, the signal output from the decoding circuit 9, whose signal level is about 3 V in relation to the reference voltage VEE, is shifted by the output level shifting circuit 10 to a signal level of about 40 V and is presented to the output buffer circuit 11.

The output buffer circuit 11 operates such that one of three specific voltage levels is selected in accordance with the two-bit data obtained from the decoding circuit 9 via the output level shifting circuit 10, and the gate line is energized by a signal having the voltage level thus selected.

The operation of the TFT gate drive circuit thus configured (FIG. 15) will now be described with reference to FIGS. 16–18.

FIG. 16 is a diagram depicting the voltage level of an input/output signal and the voltage level of a gate line drive signal. Specific examples of such voltage levels are shown on the right side of the drawing.

For example, the internal reference voltage VEE may be set low (about 3–20 V in relation to the external reference voltage VSS) and the internal logic power voltage VDL may be set high (about 2.3–3.6 V in relation to the reference voltage VEE), as shown in FIG. 16. In addition, the power voltage VCOM and power voltage VL from the output buffer circuit 11 may be set such that, for example, the power voltage VCOM is about 10–30 V greater than the reference voltage VSS, and the power voltage VL is about 0–10.5 V greater than the reference voltage VEE.

FIG. 17 is a diagram depicting the waveform of the gate line drive signal with three voltage levels provided by the TFT gate drive circuit shown in FIG. 15.

The gate line drive signal from each output channel in a normal state is kept at the voltage level of the power voltage VL, as shown in FIG. 17. The voltage level of the gate line drive signal rises from the power voltage VL to the power voltage VCOM during the energizing of the gate line, and this voltage level is maintained for the duration of a single clock signal CPV, which is equal to the horizontal scanning period of a pixel signal. In the next horizontal scanning period, the voltage level decreases from the power voltage VCOM to the reference voltage VEE, and this voltage level is maintained for another horizontal scanning period. Such gate line drive signals are sequentially outputted from the output channels in synchronism with the clock signal CPV.

FIG. 18 is a diagram depicting the timing of the shift data and gate line drive signals in the TFT gate drive circuit shown in FIG. 15.

When shift data STV1 are fed to the input level shifting circuit 6, data related to the logic value of 1 and based on these shift data STV1 are latched onto a shift register SR1 during the rising of the clock signal CPV, as shown in FIG. 18. The data for the logic value of 1 are sequentially shifted from the shift register SR1 to the shift register SR265 in synchronism with the subsequent clock signal CPV.

A decoding circuit DEn (where n is an integer such that $2 \leqq n \leqq 265$) generates two-bit data for selecting one of three voltage levels in accordance with the shift direction switching signal L/R and the data latched onto shift registers SRn−1, SRn, and SRn+1.

In the example in which the gate line drive signal shown in FIG. 18 is generated, two-bit data are generated by the decoding circuit DEn, assuming that the output voltage level coincides with the power voltage VCOM when the shift register SRn is under conditions corresponding to the logic value of 1 and the shift register SRn+1 is under conditions corresponding to the logic value of 0, the output voltage level coincides with the reference voltage VEE when the shift register SRn is under conditions corresponding to the logic value of 0 and the shift register SRn+1 is under conditions corresponding to the logic value of 1, and the output voltage level coincides with the power voltage VL when the shift register SRn and the shift register SRn+1 are both under the conditions corresponding to the logic value of 0. It should be noted, however, that the aforementioned conditions correspond to a case in which the shift direction is set on the assumption that the shift data STV1 are inputted and the shift data STV2 are outputted, and the output voltage level is set based on the condition that the aforementioned shift register SRn+1 is re-read as a shift register SRn−1 when the reverse shift direction is set.

An example in which the TFT gate drive circuit shown above in FIG. 15 is mounted on a semiconductor chip will now be described with reference to FIG. 19.

FIG. 19 is a diagram depicting a layout example of the TFT gate drive circuit shown in FIG. 15.

FIG. 19*a* is an overall layout drawing, and FIG. 19*b* is an expanded layout drawing of area A1 in FIG. 19*a*.

Output channels OUT1–OUT58 and output channels OUT208–OUT265 for the gate line drive signal are arranged in a line in numerical order in the upper area of the chip in FIG. 19*a*, output channels OUT59–OUT207 are arranged in a line in numerical order in the lower area of the chip, and the circuit blocks of the output buffer circuit 11, output level shifting circuit 10, decoding circuit 9, and bidirectional shift register 8 corresponding to each output channel are disposed adjacent to the same area as the output channel in the manner shown in FIG. 19*a*. In addition, an input level shifting circuit 6 is disposed in the center of the upper area, and the output channels OUT1–OUT58 and output channels OUT208–OUT265 are disposed to the left and right thereof.

The shift register circuit SRn, decoding circuit DEn, output channel LSn, and output buffer circuit BFn, which constitute a circuit block associated with the n-th output channel, are disposed in the upper area in the direction from the lower side to the upper side of the chip in the order indicated, and in the lower area in the direction from the upper side to the lower side of the chip in the order indicated, as shown by the expanded layout diagram of FIG. 19*b*. In other words, the circuit blocks of the output channels are disposed as upper and lower halves symmetrical about the border between the upper area and the lower area.

Shift data STV1, which are inputted from the input level shifting circuit 6 in the center of the upper area to the shift register SR1 adjacent thereto on the right side thereof, are shifted to the right in order from shift register SR2 to shift register SR58, shifted from the shift register SR58 in the upper area to the shift register SR59 in the lower area, and then sequentially shifted to the left in order from shift register SR60 to shift register SR207, as shown by the dotted line in FIG. 19*b*. Although this is not shown in FIG. 19*b*, the data are shifted from the shift register SR207 to the shift register SR208, then shifted to the right in order from the shift register SR209 to the shift register SR265, and subsequently presented as shift data STV2 to the input level shifting circuit 6. The aforementioned shifting direction can be reversed in accordance with the shift direction switching signal L/R.

The shift data outputted from the input level shifting circuit 6 in the center of the upper area are thus sequentially shifted from the upper area to the lower area and are returned to the input level shifting circuit 6 in the upper area.

SUMMARY OF THE INVENTION

Drive ICs for liquid-crystal displays containing such gate line drive circuits are configured such that the number of circuit transistors tends to increase and the chips tend to become bigger with an increase in the number of pins needed to accommodate higher packaging density and in the number of horizontal lines needed to accommodate higher-quality pixels. Since increased chip size is accompanied by higher manufacturing costs, a need has long existed for minimizing the chip size in order to be able to manufacture less expensive drive ICs.

When, however, the output voltage level of the above-described TFT drive circuits reaches its maximum (about 40 V), the voltage thus produced is higher than the logic level (about 3 V), so transistors having higher withstand voltages and larger element dimensions in comparison with transistors having regular withstand voltages must be used for the output level shifting circuits, output buffer circuits, and other circuit blocks capable of handling such high voltages, creating the need to provide larger surface areas in order to accommodate these circuit blocks. It has been proposed to reduce the surface areas needed to accommodate such circuit blocks by, for example, reducing the number of transistors with high withstand voltages or reducing the element dimensions of such transistors, but these measures have largely been unsuccessful in providing cost reductions beyond those already achieved.

Another drawback is that devising circuit improvements and other measures aimed at achieving moderate reductions in the number of transistors in shift register circuits, decoding circuits, and other circuit blocks based on transistors with ordinary withstand voltages contributes only slightly to reducing the chip size because the surface areas occupied by such transistors are negligible in comparison with the surface areas occupied by transistors with high withstand voltages on such circuit blocks.

One aspect of the present invention, which was perfected in view of the above situation, is to provide a drive circuit whose size can be reduced with greater efficiency.

Aimed at attaining the stated aspect, the inventive drive circuit, which is designed to sequentially supply a drive voltage to a plurality of output lines, comprises a first shift register provided with m (where m is an integer of 2 or greater) serially connected bit circuits and designed to shift a drive data input away from the first bit circuit toward the m-th bit circuit on the basis of a clock signal in a first state, and to shift the drive data input away from the m-th bit circuit toward the first bit circuit on the basis of a clock signal in a second state; a first output circuit with m output units that correspond to the bit circuits of the first shift register and that present the first output line with a drive voltage based on data from the bit circuits in the first state; and a second output circuit with m output units that correspond to the bit circuits of the first shift register and that present the second output line with a drive voltage based on data from the bit circuits in the second state.

In addition, each output unit of the first output circuit presents the first output line with a first drive voltage as a nonselective drive voltage in the second state, and each output unit of the second output circuit presents the second output line with the first drive voltage as a nonselective drive voltage in the first state.

The drive circuit of the present invention may also comprise a second shift register provided with n (where n is an integer of 2 or greater) serially connected bit circuits and configured such that the data fed to the first bit circuit from the m-th bit circuit of the first shift register are shifted on the basis of a clock signal and fed from the n-th bit circuit to the m-th bit circuit of the first shift register; and a third output circuit with n output units that correspond to the bit circuits of the second shift register and that present the third output line with a drive voltage based on the data from the bit circuits.

The drive circuit of the present invention may also comprise a decoding circuit with m decoders that correspond to the bit circuits of the first shift register and that present the output unit of the first output circuit or the output unit of the second output circuit with a decoding signal for selecting a drive voltage on the basis of the data from the bit circuits.

It is also possible to use a structure in which each output unit of the first or second output circuit presents the first or second output line with a drive voltage selected from the first drive voltage as a nonselective drive voltage based on the decoding signal, a second drive voltage as a selective drive voltage, and a third drive voltage as a nonselective drive voltage.

REFERENCE NUMERALS AND SYMBOLS AS SHOWN IN THE FIGURES

1: TFT, 2: liquid crystal, 3: gate drive circuit, 4: data drive circuit, 5: timing control circuit, 6: input level shifting circuit, 8: shift register circuit, 9: decoding circuit, 10: output level shifting circuit, 11: output buffer circuit, 21–25: shift register circuits, BF1–BF265: output buffer circuits, LS1–LS265: output level shifting circuit, SW1–SW265: switching circuits; DE1–DE265: decoding circuits; SR57–SR265: shift register circuits.

DESCRIPTION OF THE EMBODIMENTS

First to fifth embodiments of the present invention will now be described with reference to FIGS. 1–13.

First Embodiment

Figure 1:
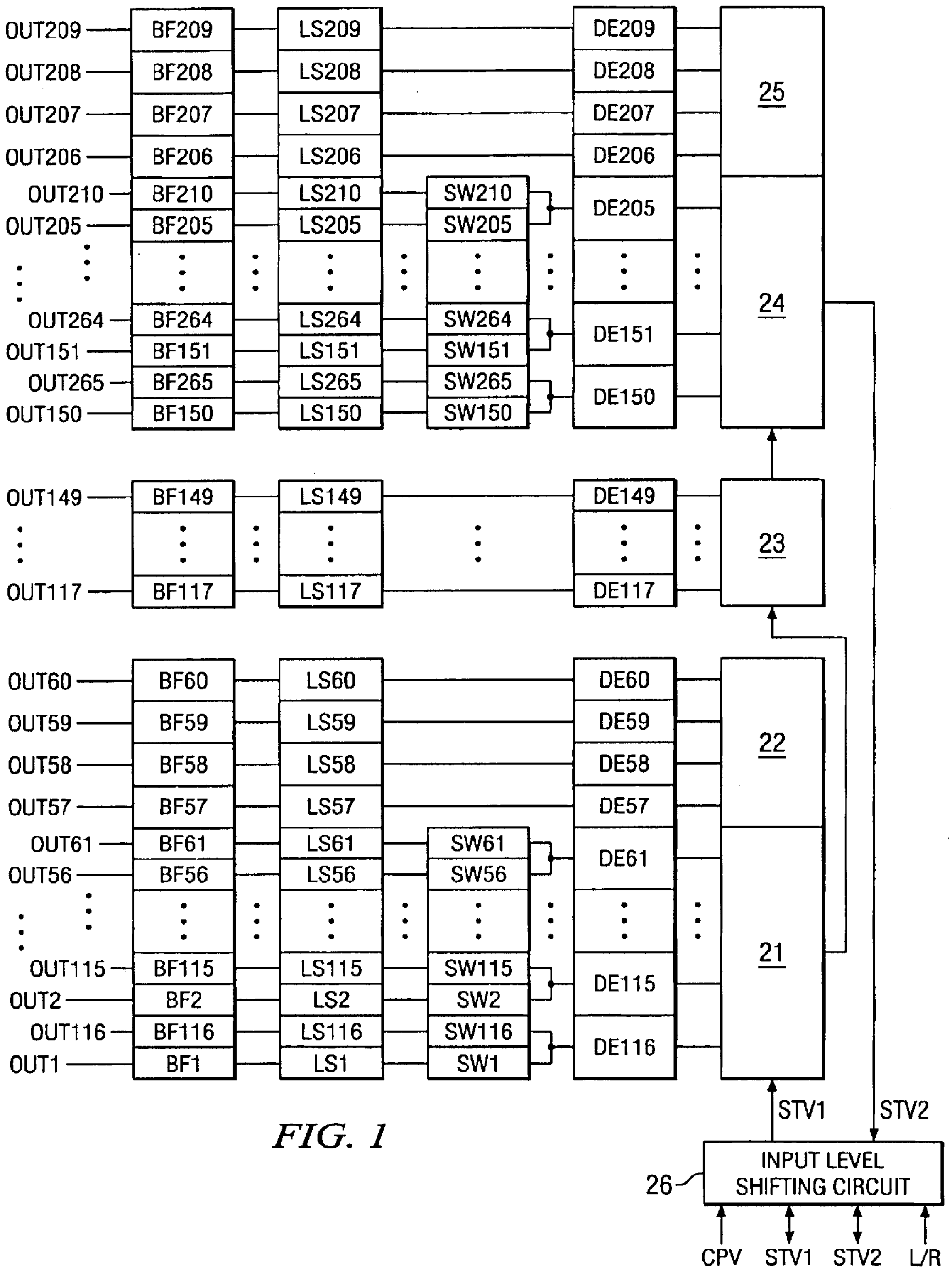
FIG. 1 is a schematic block diagram depicting a structural example of the TFT gate drive circuit pertaining to the first embodiment of the present invention.

FIG. 1 is a schematic block diagram depicting a structural example of the TFT gate drive circuit pertaining to the first embodiment of the present invention. The circuit comprises 265 output channels for energizing gate lines.

In FIG. 1, 21–25 are bidirectional shift register circuits, 26 is an input level shifting circuit, DE57–DE209 are decoding circuits associated with the corresponding output channels, SW1–SW256 are switching circuits, LS1–LS265 are level shifting circuits associated with the corresponding output channels, and BF1–BF265 are output buffer circuits.

The shift register circuits 21–25 operate such that the shift data STV1 (or STV2) provided by the input level shifting circuit 26 are sequentially shifted in terms of bits in synchronism with a clock signal CPV in the direction associated with a shift direction selection signal SEL_SFT. The data contained in each bit are presented to the corresponding decoding circuits DE57–DE209.

Depending on the control action of the shift direction selection signal SEL_SFT (not shown) generated by the input level shifting circuit 26, different functions involved in shifting data (hereinafter referred to as "drive data") designed to energize the gate lines are performed by the shift register circuits 21 and 24 and the shift register circuits 22, 23, and 25.

Specifically, the shift register circuits 22, 23, and 25 allow drive data to be shifted in a single direction, whereas the shift register circuits 21 and 24 allow single-cycle reciprocating shifts to be made in both directions. Different output channels can be energized during the forward and return portions of the cycle by the drive data moved back and forth by the shift register circuits 21 and 24.

Different functions are performed by the shift direction switching signal L/R provided from the outside to the input level shifting circuit 26 and by the shift direction selection signal SEL_SFT generated inside the input level shifting circuit 26. Specifically, the shift direction switching signal L/R reverses the sequence in which gate line drive signals are outputted from the output channels, but the shift direction selection signal SEL_SFT merely inverts the shift direction of the shift register circuits 21–25 without reversing the sequence. Gate line drive signals are outputted from each of the output channels in channel number sequence as a result of the fact that the shift direction selection signal SEL_SFT is controlled with the timing shown below with reference to FIG. 3.

Figure 17:
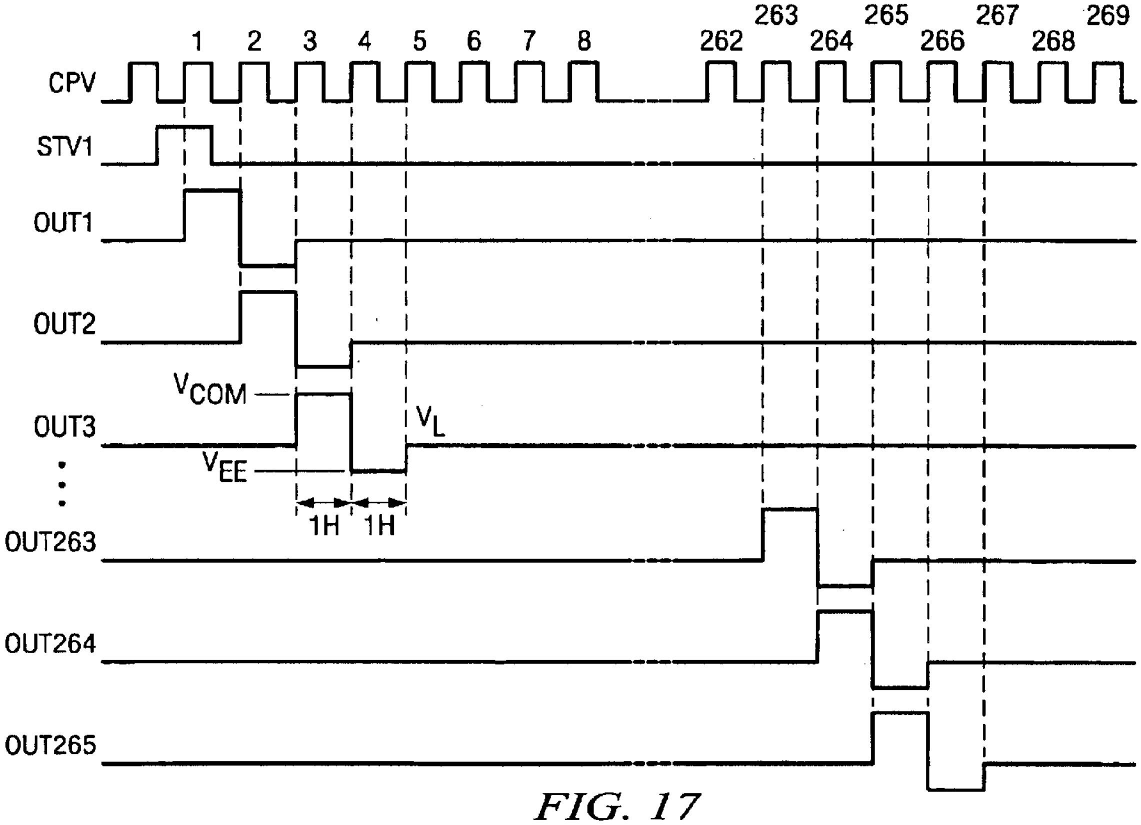
FIG. 17 is a diagram depicting the waveform of the gate line drive signal with three voltage levels provided by the TFT gate drive circuit shown in FIG. 15.
Figure 18:
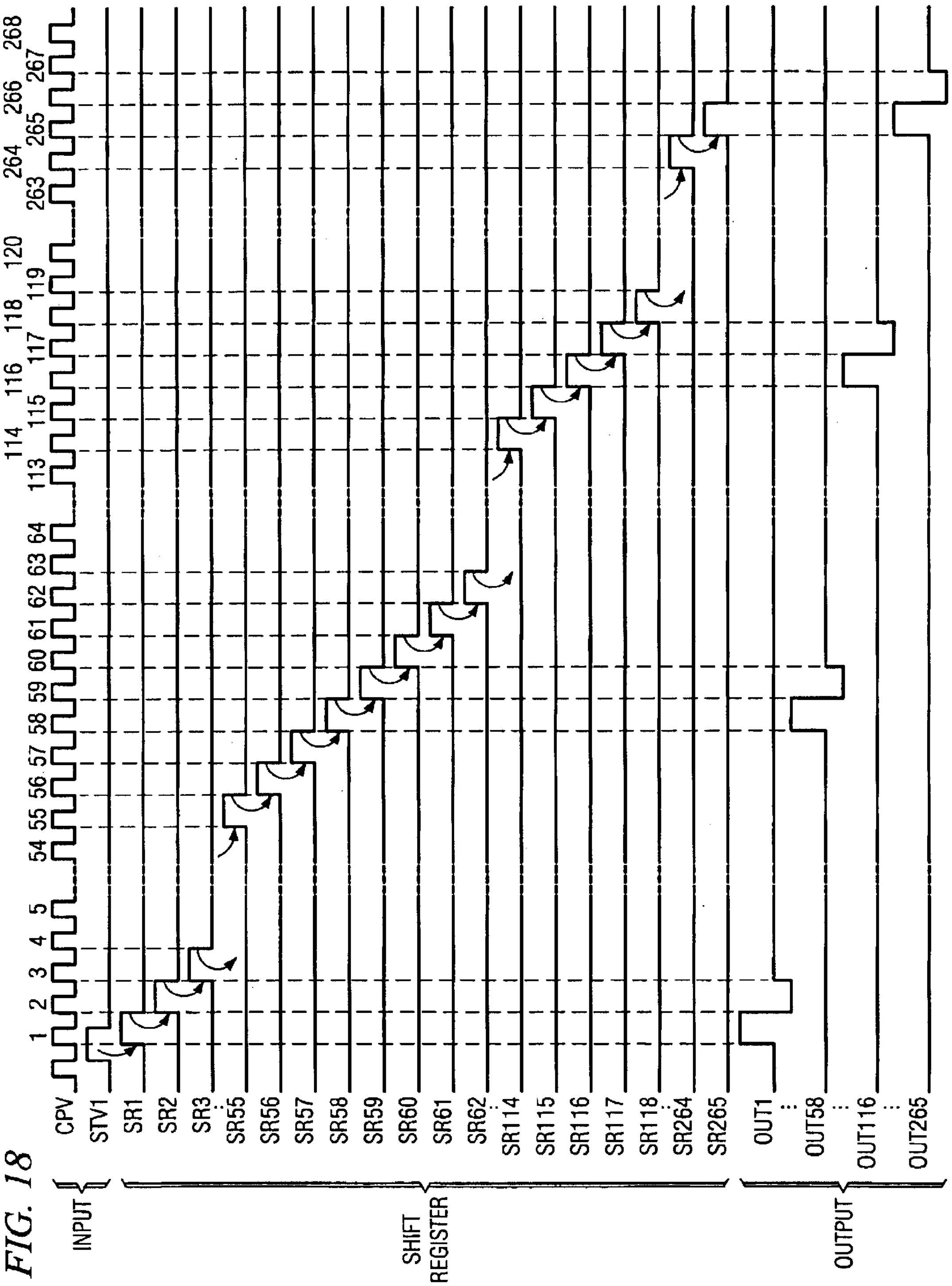
FIG. 18 is a diagram depicting the timing of shift data and gate line drive signals in the TFT gate drive circuit shown in FIG. 15.

The decoding circuits DE57–DE209 decode the shift direction switching signal L/R and the three-bit data obtained by combining the bits of the shift register circuits 21–25 with the preceding and subsequent bits, and generate two-bit data for selecting one of three voltage levels. As shown, for example, in FIG. 17, the two-bit data are generated by outputting the voltage level of the power voltage VL in the normal state, the high voltage level of the power voltage VCOM in the period that starts with the energizing of the gate lines and lasts through a horizontal scan period, and a low voltage level of the reference voltage VEE during the next horizontal scan period.

In other words, two-bit data for selecting the desired output voltage level are generated in the decoding circuits DE57–DE209 in accordance with the relationship between each data bit and the bit position of the drive data obtained by the bit shifting of the shift register circuits 21–25.

The two-bit data thus generated are outputted to the switching circuits SW1–SW56, switching circuits SW61–SW116, switching circuits SW150–SW205, switching circuits SW210–SW265, output level shifting circuits LS57–LS60, output level shifting circuits LS117–LS149, and output level shifting circuits LS206–LS209, which are associated with the corresponding bits.

The switching circuits SW1–SW265 are controlled in accordance with an upper channel block selection signal SEL_UP or lower channel block selection signal SEL_LO (not shown) generated by the input level shifting circuit 26.

The switching circuits SW1–SW56 and the switching circuits SW265–SW210 are enabled when the upper channel block selection signal SEL_UP has a logic value of 1, and the two-bit data outputted from the decoding circuits DE116–DE61 and the decoding circuits DE265–DE210 are presented to the output level shifting circuits LS1–LS56 and output level shifting circuits LS265–LS210, respectively. These switching circuits are disabled when the upper channel block selection signal SEL_UP has a logic value of 0, and the two-bit data for which the voltage level of the gate line drive signal is set to the power voltage VL (voltage level at which the TFE is kept in the "off" state) are presented to the corresponding output level shifting circuits.

The switching circuits SW116–SW61 and the switching circuits SW150–SW205 are enabled when the lower channel block selection signal SEL_LO has a logic value of 1, and the two-bit data outputted from the decoding circuits DE116–DE61 and the decoding circuits DE150–DE205 are presented to the output level shifting circuits LS116–LS61 and output level shifting circuits LS150–LS205, respectively. These switching circuits are disabled when the lower channel block selection signal SEL_LO has a logic value of 0, and the two-bit data for which the voltage level of the gate line drive signal is set to the power voltage VL are presented to the corresponding output level shifting circuits.

The output level shifting circuits LS1–LS265 operate such that the signal level of the two-bit data obtained from the decoding circuits DE57–DE60, decoding circuits DE117–DE149, decoding circuits DE206–DE209, switching circuits SW1–SW56, switching circuits SW61–SW116, switching circuits SW150–SW205, and switching circuits SW210–SW265 is shifted to the signal level of the high voltage and presented to the output level shifting circuits BF1–BF265.

Figure 16:
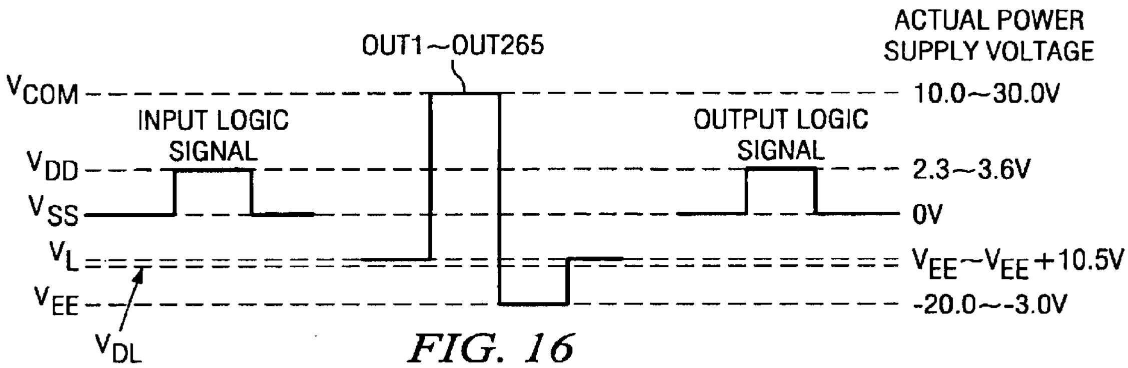
FIG. 16 is a diagram depicting the relation between the voltage level of an input/output signal and the voltage level of a gate line drive signal.

For example, the output signals derived from the decoding circuits/switching circuits at a signal level of about 3 V in relation to the reference voltage VEE are shifted by the output level shifting circuits LS1–LS265 to a signal level of about 40 V and presented to the output buffer circuits BF1–BF265, as shown in FIG. 16.

The output buffer circuits BF1–BF265 operate such that a single voltage level is selected from three specific voltage levels (power voltage VCOM, power voltage VL, and reference voltage VEE, shown in FIG. 16) in accordance with the two-bit data for selecting the shifted voltage levels inputted from the corresponding output level shifting circuits LS1–LS265, and the gate lines are energized by the signals with the voltage levels thus selected.

The input level shifting circuit 26 allows the logic level of the input/output signal (between the power voltage VDD and the reference voltage VSS) to be shifted to the internal logic level of the gate drive circuit (between the power voltage VDL and the reference voltage VEE). Specifically, the levels of clock signals CPV, shift data STV1 and STV2, shift direction switching signals L/R, and other input/output signals are converted to the internal logic level of the gate drive circuit, and the input/output signals thus converted are provided to the shift register circuits 21–25 or decoding circuits DE57–DE205.

The input level shifting circuit 26 generates a shift direction selection signal SEL_SFT for controlling the shift direction of data in the shift register circuits 21–25, and is controlled such that the drive data move back and forth in the shift register circuits 21 and 24. According to one possible example, the number of times the drive data have been shifted is counted by a counter, and a shift direction selection signal SEL_SFT is generated in accordance with the counting results. Another possibility is to generate the shift direction selection signal SEL_SFT by detecting that drive data have reached a specific bit position in which the shift direction can be altered.

The input level shifting circuit 26 operates such that an upper channel block selection signal SEL_UP for enabling or disabling the switching circuits SW1–SW56 and switching circuits SW210–SW265 is generated in accordance with the shift direction selection signal SEL_SFT. Specifically, the upper channel block selection signal SEL_UP is provided with a logic value of 1 and the switching circuits are enabled when the drive data are shifted in terms of direction from the shift register circuit 21 to the shift register circuit 22 and from the shift register circuit 25 to the shift register circuit 24. In all other cases the upper channel block selection signal SEL_UP is provided with a logic value of 0, and the switching circuits are disabled.

Similarly, the input level shifting circuit 26 operates such that a lower channel block selection signal SEL_LO for enabling or disabling the switching circuits SW61–SW116 and switching circuits SW150–SW205 is generated in accordance with the shift direction selection signal SEL_SFT. Specifically, the lower channel block selection signal SEL_LO is provided with a logic value of 1 and the switching circuits are enabled when the drive data are shifted in terms of direction from the shift register circuit 22 to the shift register circuit 21 and from the shift register circuit 24 to the shift register circuit 25. In all other cases the lower channel block selection signal SEL_LO is provided with a logic value of 0, and the switching circuits are disabled.

The operation of the TFT gate drive circuit configured as described above and shown in FIG. 1 will now be described with reference to FIGS. 2 and 3.

Figure 2:
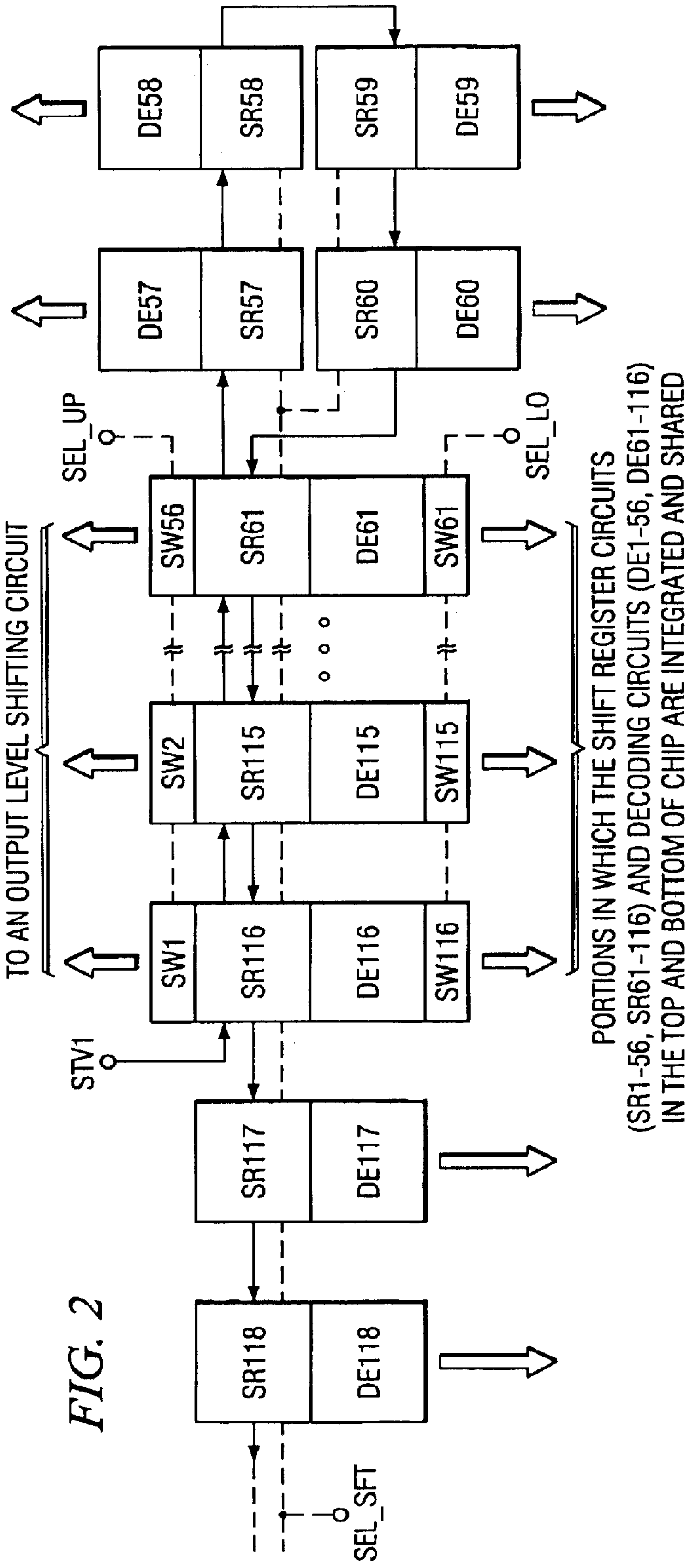
FIG. 2 is a schematic block diagram illustrating the shared portion of shift register circuitry in the TFT gate drive circuit shown in FIG. 1.

FIG. 2 is a schematic block diagram illustrating the shared portion of shift register circuitry in the TFT gate drive circuit shown in FIG. 1. The illustration is limited to the shift registers SR57–SR118 and to the decoding circuits and switching circuits associated therewith.

Figure 3:
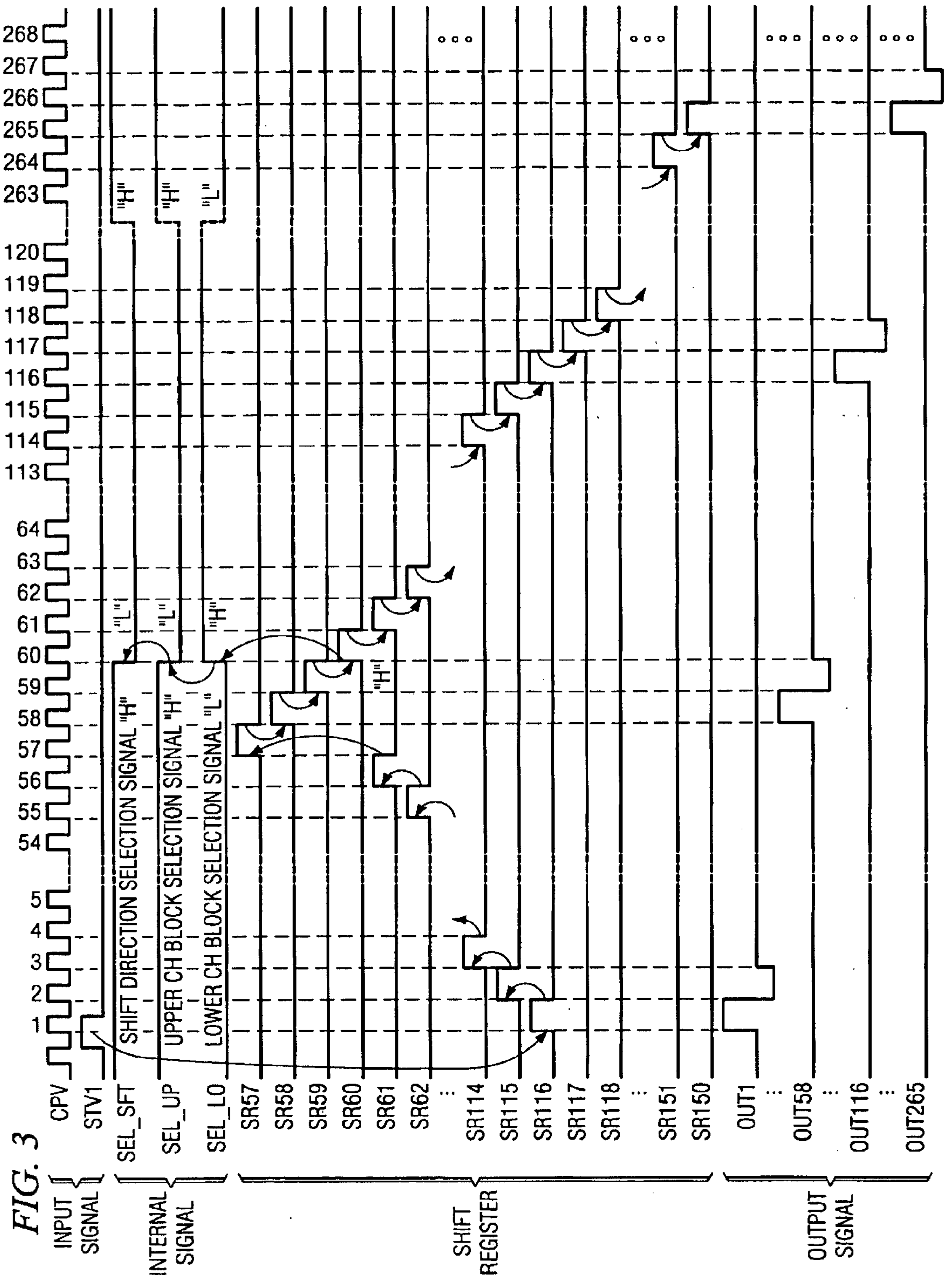
FIG. 3 is a timing diagram illustrating the operation of the TFT gate drive circuit shown in FIG. 1.

FIG. 3 is a timing diagram illustrating the operation of the TFT gate drive circuit shown in FIG. 1.

When presented to the input level shifting circuit 26, the shift data STV1 (drive data) with a logic value of 1 are latched onto the shift register SR116 of the shared portion (shown in FIG. 2) in synchronism with the rise of the clock signal CPV1. In the process, the shift direction selection signal SEL_SFT acquires a logic value of 1, and the drive data are sequentially shifted in the direction from the shift register SR115 to the shift register SR61 in synchronism with the rise of the clock signal CPV, as shown by the arrow in FIG. 2. Also at this time, the switching circuits SW1–SW56 are disabled because the upper channel block selection signal SEL_UP has a logic value of 1, and the two-bit data from the decoding circuits DE116–DE61 are presented to the respective output level shifting circuits LS1–LS56 via these switching circuits. The high-voltage (power voltage VCOM) gate line drive signals of the output channels OUT1, OUT2, and OUT3 will therefore be sequentially outputted in accordance with the shifting of the drive data. Since the lower channel block selection signal SEL_LO has a logic value of 0, the switching circuits SW61–SW116 are disabled and the voltage level of the output channels OUT61–OUT116 retains the power voltage VL irrespective of the shifting of the drive data.

The drive data shifted from the shift register SR61 to the shift register SR57 are further shifted from the shift register SR58 to the shift register SR60 and are then returned to the shift register SR61. When the clock signal CPV rises and the shift register SR60 acquires a logic value of 1, the shift direction selection signal SEL_SFT is caused by the input level shifting circuit 26 to change its logic value from 1 to 0, and the shift direction of each shift register is inverted in a corresponding manner. The drive data returned to the shift register SR61 are thereby sequentially shifted from the shift register SR61 to the shift register SR116 in the opposite direction. Also at this time, the switching circuits SW61–SW116 are disabled by the lower channel block selection signal SEL_LO, so the two-bit data from the decoding circuits DE61–DE116 are presented to the respective output level shifting circuits LS61–LS116 via these switching circuits. The high-voltage (power voltage VCOM) gate line drive signals of the output channels OUT61, OUT62, and OUT63 are therefore sequentially outputted in accordance with the shifting of the drive data. Since the upper channel block selection signal SEL_UP has a logic value of 0, the switching circuits SW1–SW56 are disabled and the voltage level outputted from the output channels OUT1–OUT56 retains the power voltage VL irrespective of the shifting of the drive data.

The drive data shifted in the direction from the shift register SR61 to the shift register SR116 are further inputted from the shift register circuit 21 (FIG. 1) to the shift register circuit 24 via the shift register circuit 23. In the process, the shift direction selection signal SEL_SFT acquires a logic value of 0 and is sequentially shifted in the direction from the shift register circuit 24 to the shift register circuit 25. In addition, the upper channel block selection signal SEL_UP has a logic value of 0, and the lower channel block selection signal SEL_LO has a logic value of 1, thus disabling the switching circuits SW265–SW210 and enabling the switching circuits SW150–SW205. High-voltage gate line drive signals are therefore outputted in the sequence "output channels OUT150, OUT151, OUT152" in accordance with the shifting of the drive data.

Once the drive data shifted in the direction of the shift register circuit 25 reach the end bit of the shift register circuit 25, the shift direction selection signal SEL_SFT, upper channel block selection signal SEL_UP, and lower channel block selection signal SEL_LO are inverted, and the shift direction of drive data and the enabling and disabling of the switching circuits are inverted in a corresponding manner. The drive data are thereby shifted in the direction from the shift register circuit 25 to the shift register circuit 24, and high-voltage gate line drive signals are outputted in the sequence "output channels OUT210, OUT211, OUT212."

High-voltage gate line drive signals are thus sequentially outputted from the output channel OUT1 to the output channel OUT265 in accordance with the shifting of the drive data.

An example in which the TFT gate drive circuit shown in FIG. 1 is mounted on a semiconductor chip will now be described with reference to FIG. 4.

Figure 4A:
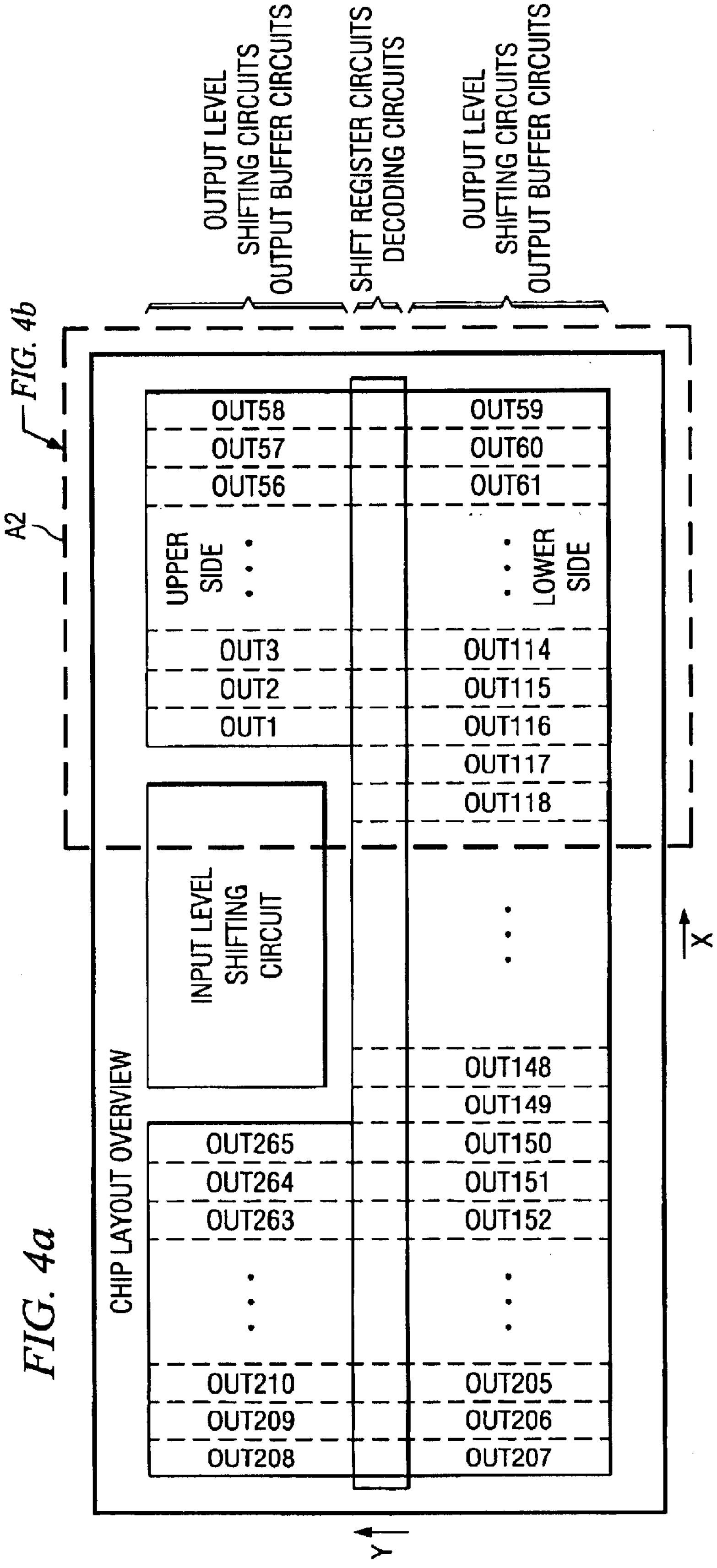
FIG. 4 is a diagram depicting a layout example of the TFT gate drive circuit shown in FIG. 1.
Figure 4B:
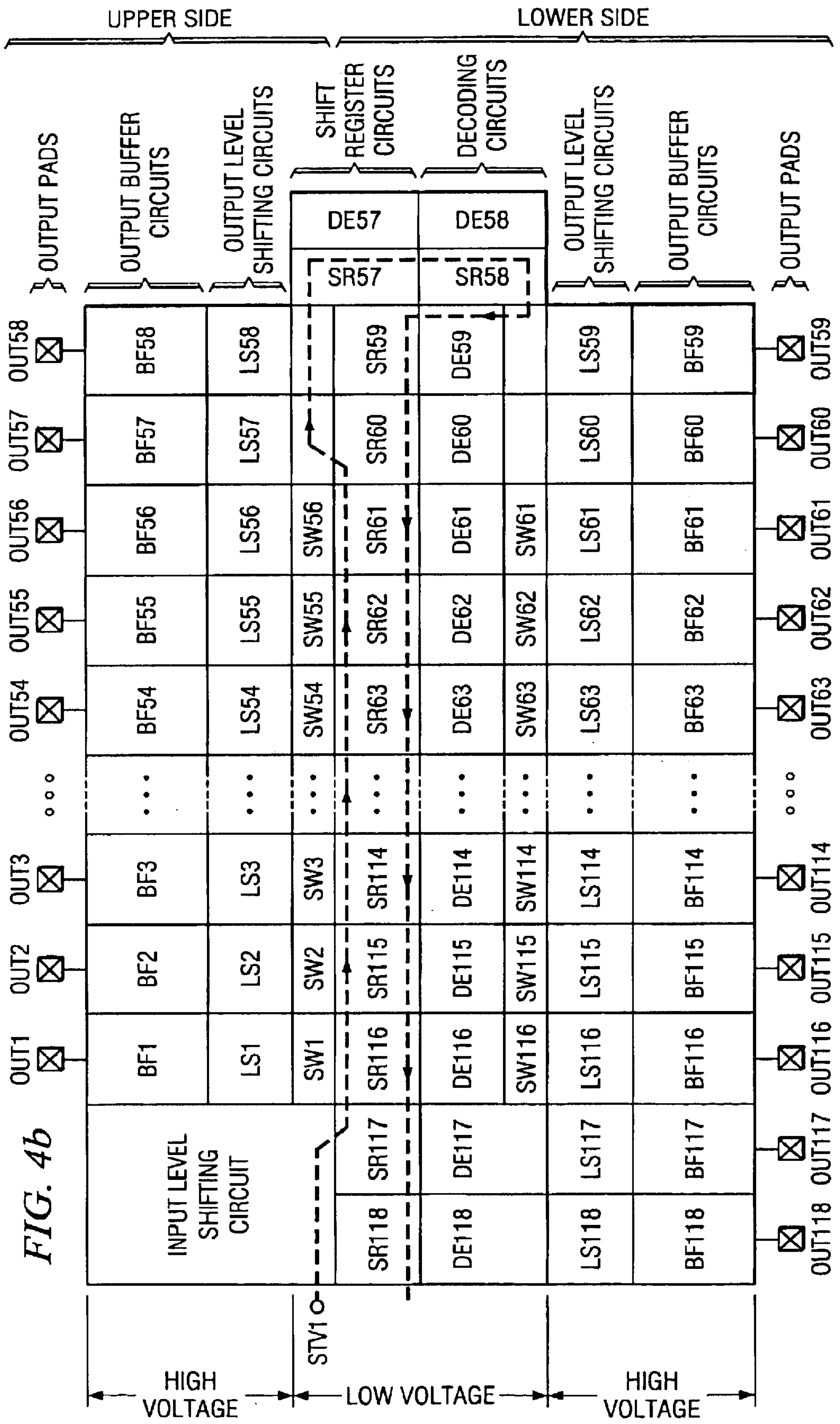

FIG. 4 is a diagram depicting a layout example of the TFT gate drive circuit shown in FIG. 1. FIG. 4*a* is a layout diagram of the entire assembly, and FIG. 4*b* is a layout diagram depicting in enlarged form the area A2 shown in FIG. 4*a*.

The circuit blocks associated with the output channels OUT1–OUT58 and output channels OUT208–OUT265 of gate line drive signals are arranged in a line in numerical order in the upper area of the chip in FIG. 4*a*, and the circuit blocks associated with the output channels OUT59–OUT207 are arranged in a line in numerical order in the lower area of the chip, as shown in FIG. 4*a*. The input level shifting circuit 26 is disposed in the center of the upper area, and the output channels OUT1–OUT58 and the circuit blocks of the output channels OUT208–OUT265 are disposed to the left and right thereof.

The shift register SR16–SR61 and the decoding circuits DE116–DE61 are shared by the output channels OUT1–OUT56 in the upper area and by the output channels OUT116–OUT61 in the lower area, as shown in the enlarged layout diagram in FIG. 4*b*. The switching circuits SW1–SW56 in the upper area become enabled and high-voltage gate line drive signals are sequentially outputted to the output channels OUT1–OUT56 in the upper area when the drive data presented to the shift register SR116 from the input level shifting circuit 26 are shifted to the right in order from the shift register SR115 to the shift register SR61, as shown by the arrows. The switching circuits SW61–SW116 in the lower area become enabled and high-voltage gate line drive signals are sequentially outputted to the output channels OUT61–OUT116 in the lower area when the drive data whose shift direction has been inverted from the shift register SR57 via the shift register SR60 on the chip are shifted to the right in the direction from the shift register SR61 to the shift register SR118.

Figure 15:
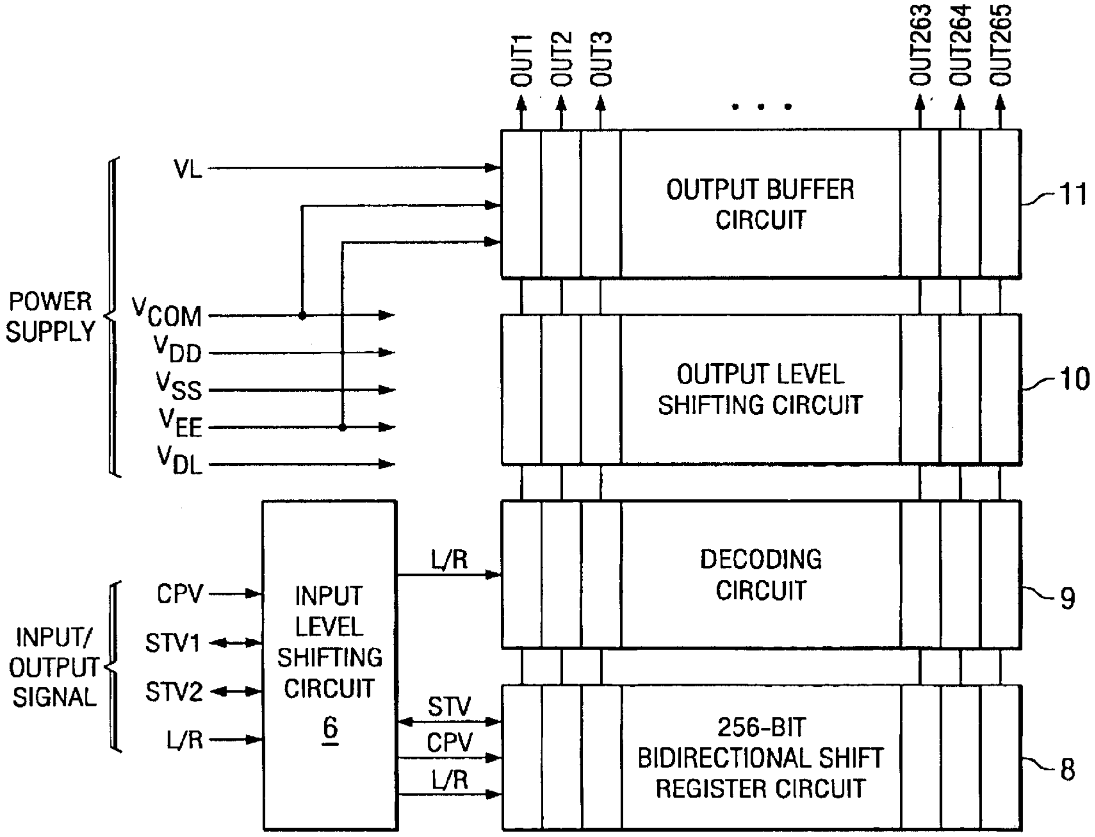
FIG. 15 is a schematic block diagram illustrating an example of a conventional TFT gate drive circuit with three voltage levels.

Thus, the TFT gate drive circuit of the present embodiment shown in FIG. 1 is configured such that some of the shift register circuits and decoding circuits are shared by a plurality of output channels, constituting a much smaller number of circuits than the one needed for the conventional TFT gate drive circuit with three voltage level outputs shown in FIG. 15. Specifically, the conventional TFT gate drive circuit shown in FIG. 15 uses 256 shift register circuits and decoding circuits, whereas the TFT gate drive circuit shown in FIG. 1 uses 153 circuits, representing an about 42% reduction in the number of circuits. The surface area of the chip can thereby be markedly reduced.

Second Embodiment

A second embodiment of the present invention will now be described with reference to FIGS. 5 and 6.

Figure 5:
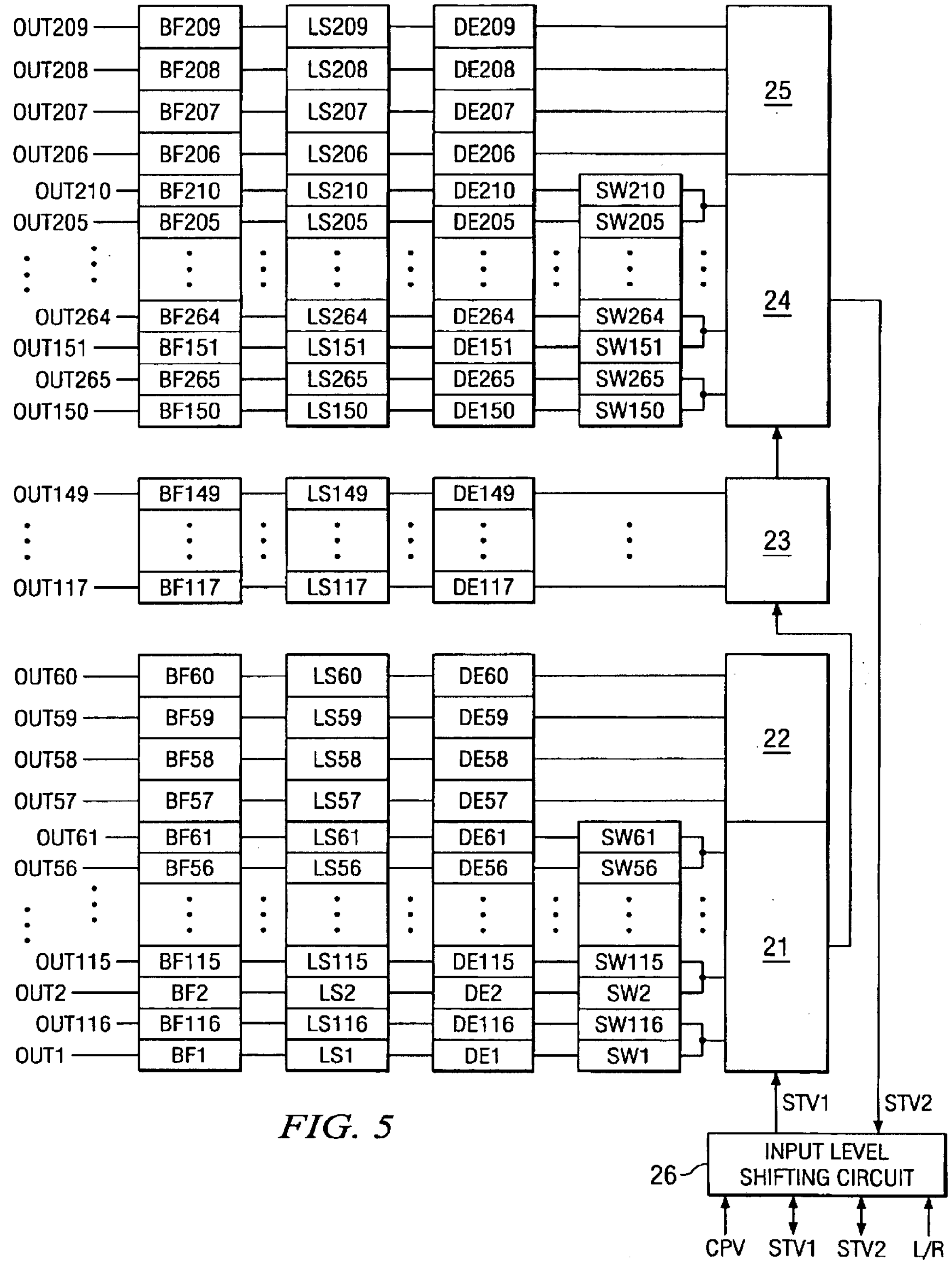
FIG. 5 is a schematic block diagram depicting a structural example of the TFT gate drive circuit pertaining to the second embodiment of the present invention.

The difference between this embodiment and the TFT gate drive circuit shown in FIG. 1 above is that whereas both the shift register circuits and decoding circuits are shared in FIG. 1, the shared components of the TFT gate drive circuit shown in FIG. 5 are limited to the shift register circuits alone.

FIG. 5 is a schematic block diagram depicting a structural example of the TFT gate drive circuit pertaining to the second embodiment of the present invention.

The same symbols in FIGS. 5 and 1 refer to identical constituent elements, with DE1–DE56 and DE210–DE265 indicating decoding circuits.

In the TFT gate drive circuit shown of FIG. 5, the shared decoding circuits shown in FIG. 1 are provided to each output channel, so the decoding circuits DE1–DE56 and decoding circuits DE21–DE265 are added to the TFT gate drive circuit of FIG. 1.

The TFT gate drive circuit shown in FIG. 5 generates the same shift direction selection signal SEL_SFT, upper channel block selection signal SEL_UP, and lower channel block selection signal SEL_LO as does the TFT gate drive circuit shown in FIG. 1. For this reason, the drive data obtained from the input level shifting circuit 26 are sequentially shifted through the shift register circuits 21–25 in the same sequence as in FIG. 1. In addition, the data presented to the output level shifting circuits are the same in FIGS. 1 and 5 except that while the shift register circuits 21 and 24 of the TFT gate drive circuit shown in FIG. 1 are configured such that the data obtained from the shift register circuits are presented to the output level shifting circuits in the sequence "decoding circuits, switching circuits," the TFT gate drive circuit shown in FIG. 5 is configured such that the data are presented to the output level shifting circuits in the sequence "switching circuits, decoding circuits." Consequently, operation of the TFT gate drive circuit shown in FIG. 5 entails outputting gate line drive signals from output channels in numerical order in the same manner as in the TFT gate drive circuit of FIG. 1.

Figure 6:
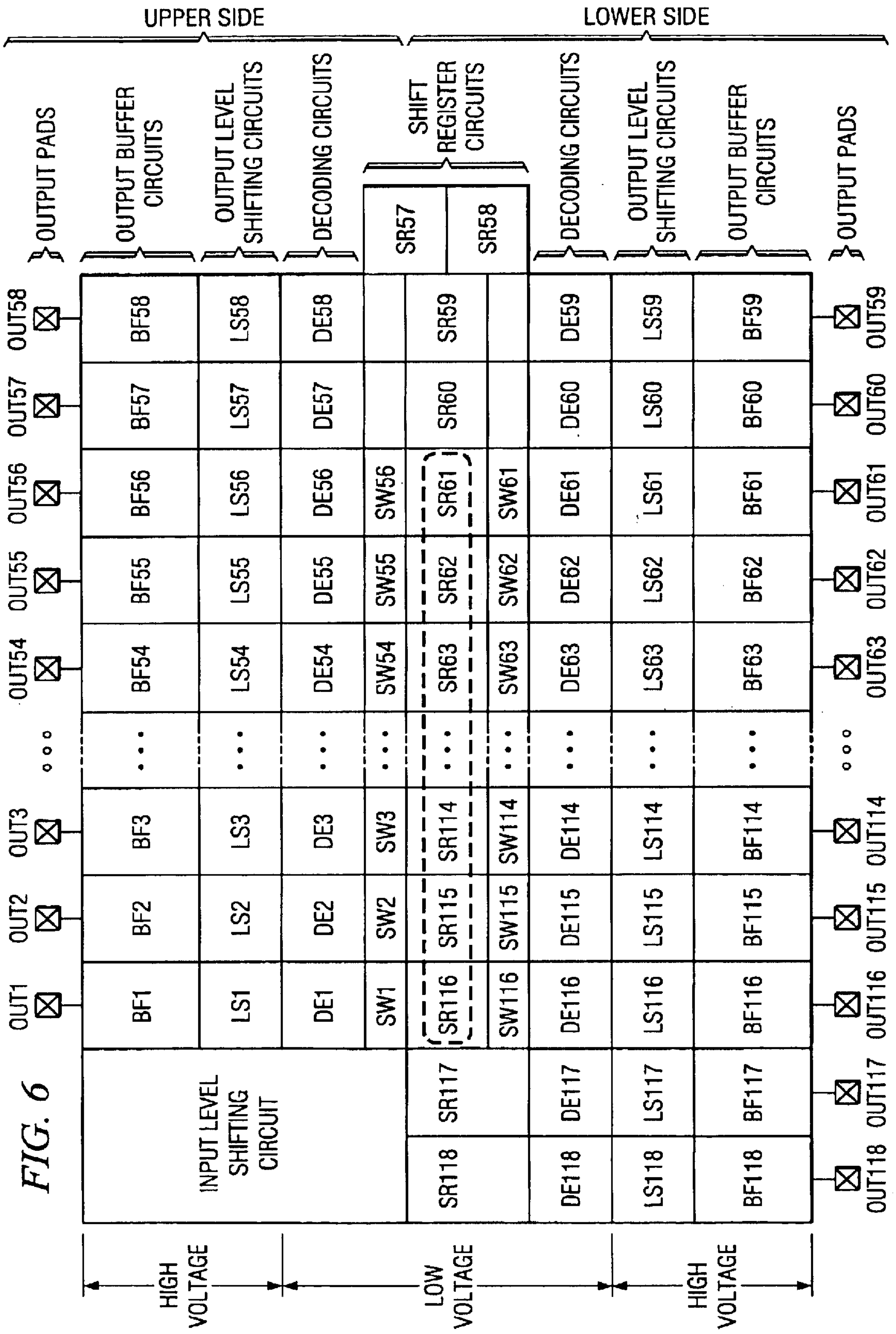
FIG. 6 is a diagram depicting a layout example of the TFT gate drive circuit shown in FIG. 5.

FIG. 6 is a diagram depicting a layout example of the TFT gate drive circuit shown in FIG. 5.

The shared decoding circuits in FIG. 4*b* are provided separately to the circuit block in the upper area and to the circuit block in the lower area, as shown in FIG. 6. The chip area will therefore be somewhat larger in the longitudinal direction than in the case of the TFT gate drive circuit shown in FIG. 1.

The design of the TFT gate drive circuit shown in FIG. 5 also allows the number of shift register circuits to be reduced in comparison with a conventional device, making it possible to use a smaller circuit size and chip area.

Third Embodiment

A third embodiment of the present invention will now be described with reference to FIGS. 7 and 8.

Figure 7:
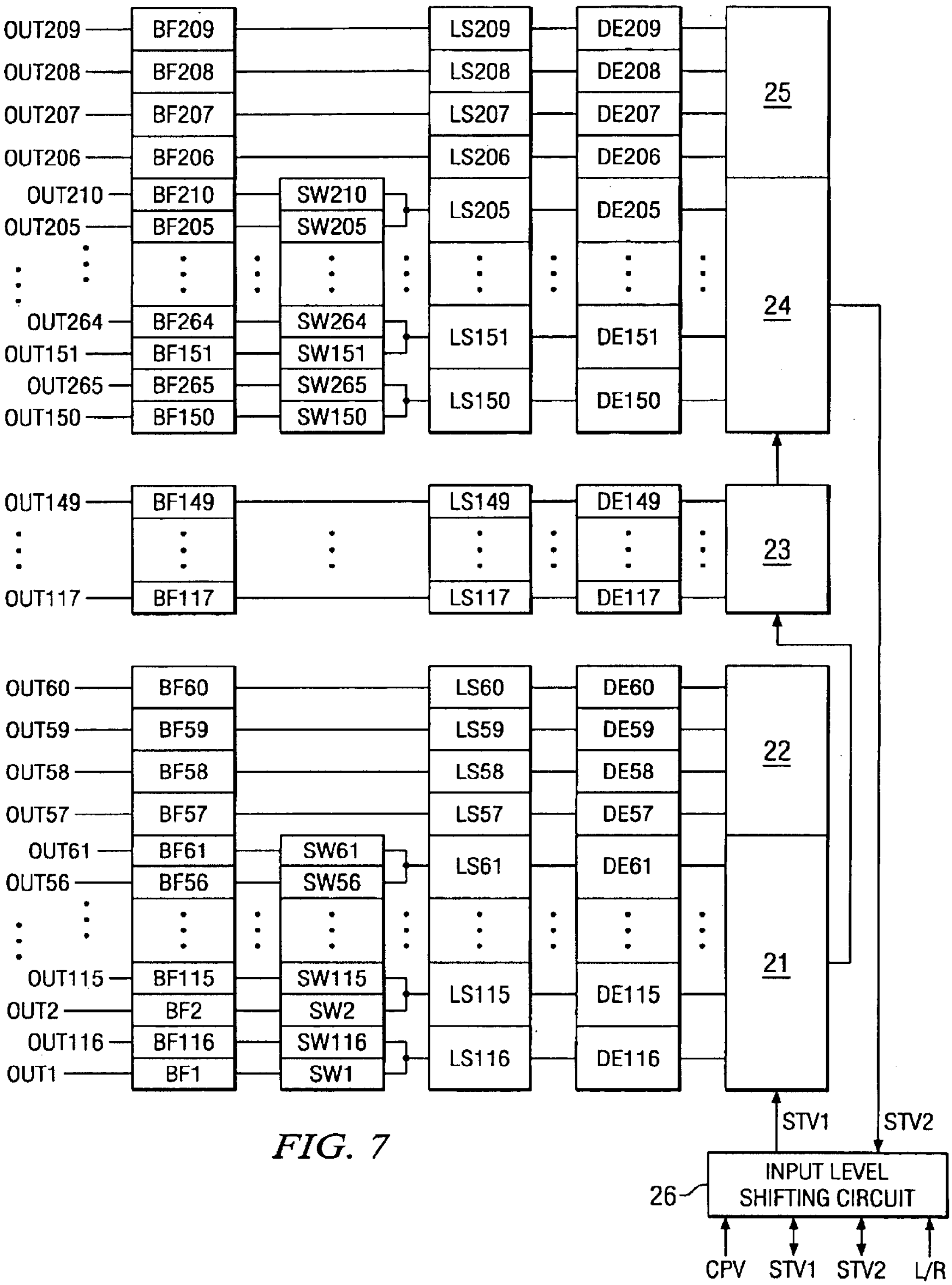
FIG. 7 is a schematic block diagram depicting a structural example of the TFT gate drive circuit pertaining to the third embodiment of the present invention.

The difference between this embodiment and the TFT gate drive circuit shown in FIG. 1 is that whereas in FIG. 1 both the shift register circuits and the decoding circuits are shared, the TFT gate drive circuit shown in FIG. 7 is configured such that the output level shifting circuits are also shared.

FIG. 7 is a schematic block diagram depicting a structural example of the TFT gate drive circuit pertaining to the third embodiment of the present invention, and the same symbols in FIGS. 7 and 1 refer to identical constituent elements.

The TFT gate drive circuit of FIG. 7 is configured such that the output level shifting circuits LS1–LS56 and output level shifting circuits LS116–LS61 provided separately in FIG. 1 are combined into output level shifting circuits LS116–LS61, and the output level shifting circuits LS150–LS205 and output level shifting circuits LS265–LS210 are combined into output level shifting circuits LS150–LS205.

The TFT gate drive circuit shown in FIG. 7 generates the same shift direction selection signal SEL_SFT, upper channel block selection signal SEL_UP, and lower channel block selection signal SEL_LO as does the TFT gate drive circuit shown in FIG. 1. For this reason, the drive data obtained from the input level shifting circuit 26 are sequentially shifted through the shift register circuits 21–25 in the same sequence as in FIG. 1. In addition, the data presented to the output buffer circuits are the same in FIGS. 1 and 7 except that while the shift register circuits 21 and 24 of the TFT gate drive circuit shown in FIG. 1 are configured such that the data obtained from the shift register circuits are presented to the output buffer circuits in the sequence "decoding circuits, output level shifting circuits, switching circuits," the TFT gate drive circuit shown in FIG. 5 is configured such that the data are presented to the output buffer circuits in the sequence "decoding circuits, output level shifting circuits, switching circuits." Consequently, operation of the TFT gate drive circuit shown in FIG. 7 entails outputting gate line drive signals from output channels in numerical order in the same manner as in the TFT gate drive circuit of FIG. 1.

Figure 8:
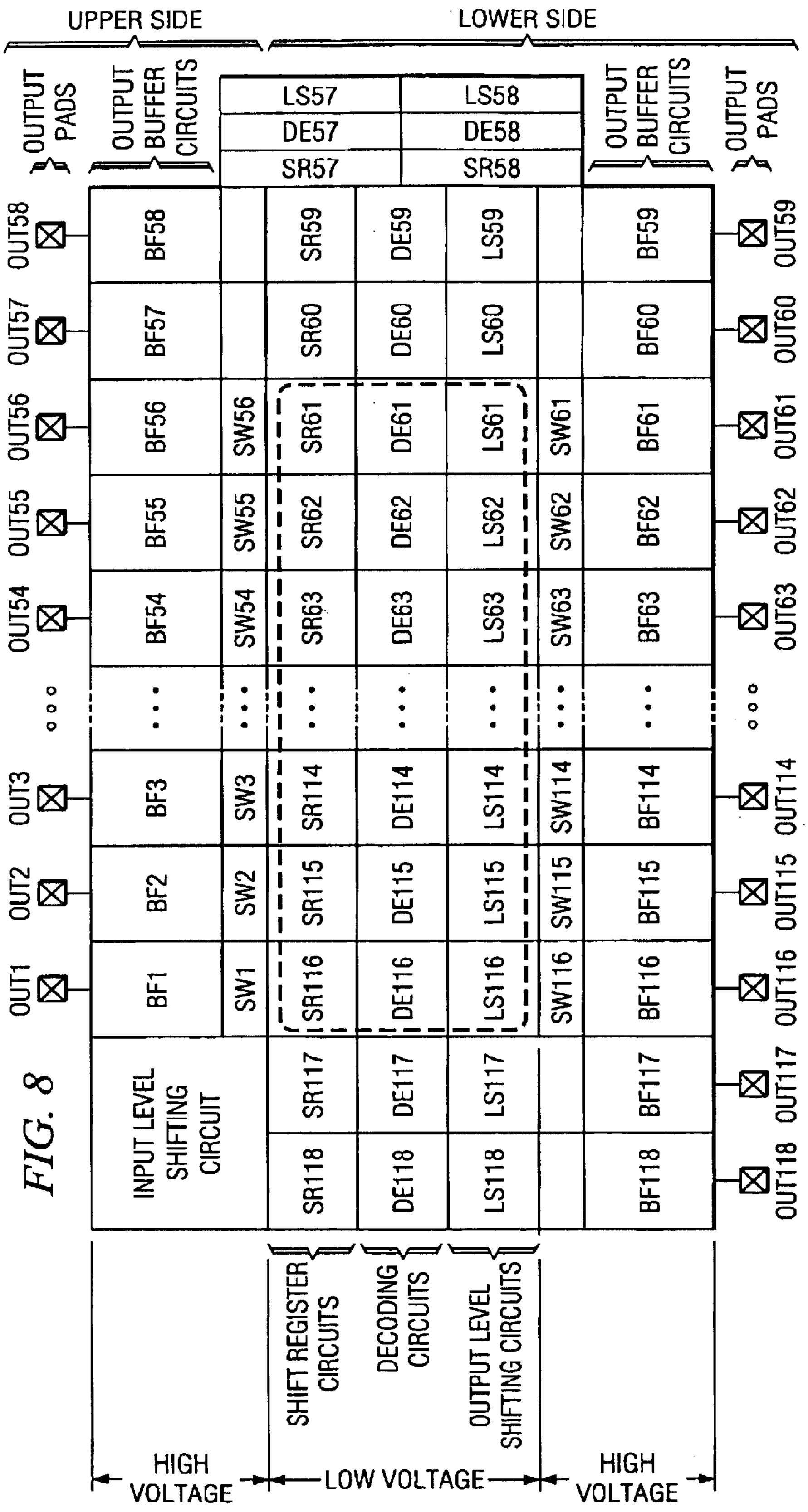
FIG. 8 is a diagram depicting a layout example of the TFT gate drive circuit shown in FIG. 7.

FIG. 8 is a diagram depicting a layout example of the TFT gate drive circuit shown in FIG. 7.

It can be seen in FIG. 8 that the output level shifting circuits provided separately to the circuit blocks in the upper and lower areas in FIG. 4*b* are shared in FIG. 8. The chip area of the TFT gate drive circuit shown in FIG. 7 can thereby be reduced in proportion to the surface area of the eliminated output level shifting circuits. In addition, the switching circuits provided between the output level shifting circuits and output buffer circuits in the manner shown in FIG. 8 are incorporated into high-voltage circuit blocks, thus increasing element dimensions (and hence the chip area) in comparison with the switching circuits of the TFT gate drive circuit shown in FIG. 1. The chip area of the TFT gate drive circuit shown in FIG. 7 can therefore be efficiently reduced in comparison with FIG. 1 if the reduction in chip area brought about by the reduced number of output level shifting circuits is greater than the increase in chip area brought about by the higher withstand voltage of the switching circuits.

Fourth Embodiment

Although the first to third embodiments were described with reference to TFT gate drive circuits with three voltage level outputs, the present invention is not limited by these examples and can also be adapted, for example, to a TFT gate drive circuit having two voltage level outputs.

Figure 9:
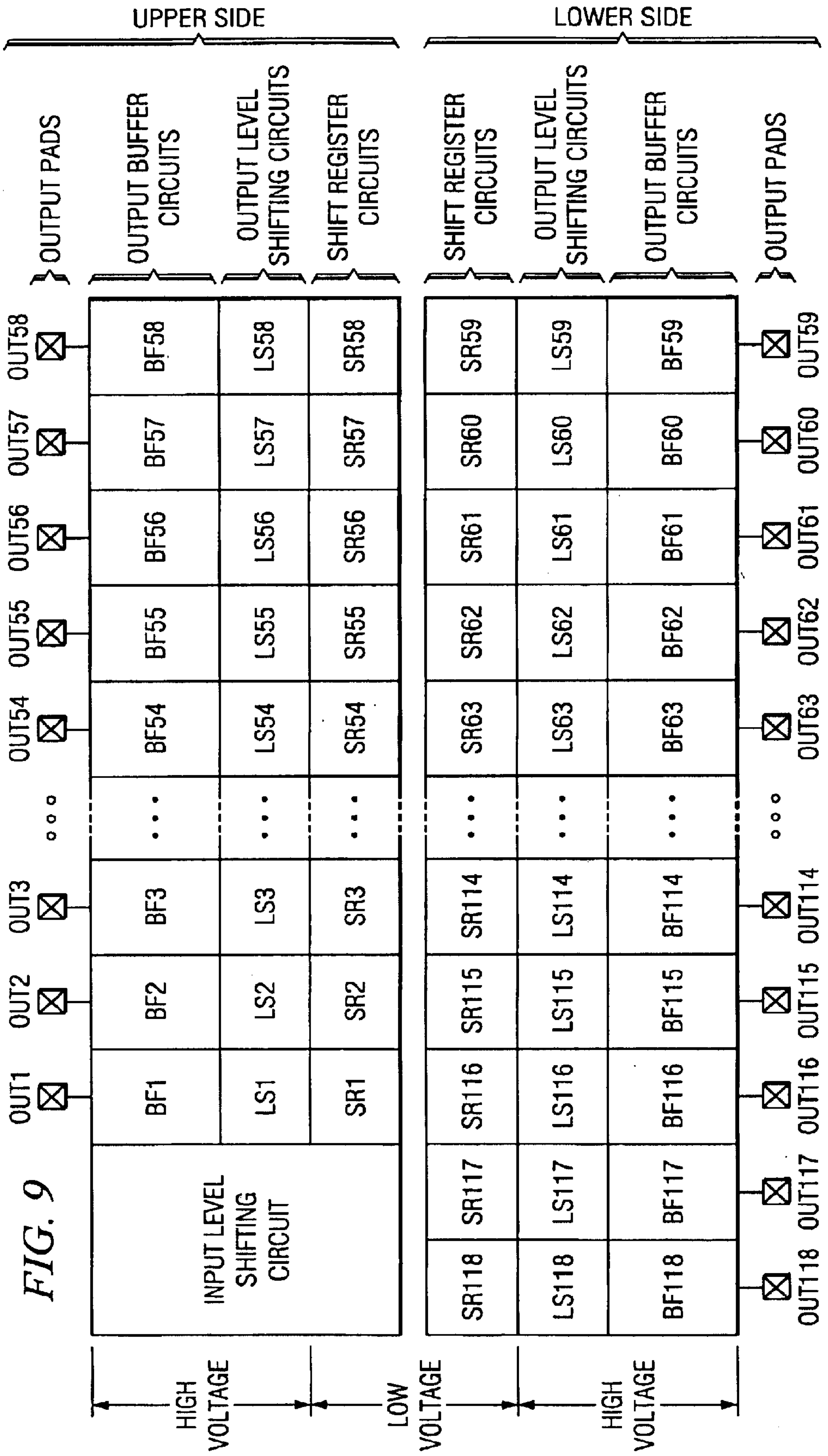
FIG. 9 is a diagram depicting a layout example of a conventional TFT gate drive circuit with two voltage level outputs.

FIG. 9 is a diagram depicting a layout example of a conventional TFT gate drive circuit with two voltage level outputs.

Figure 19A:
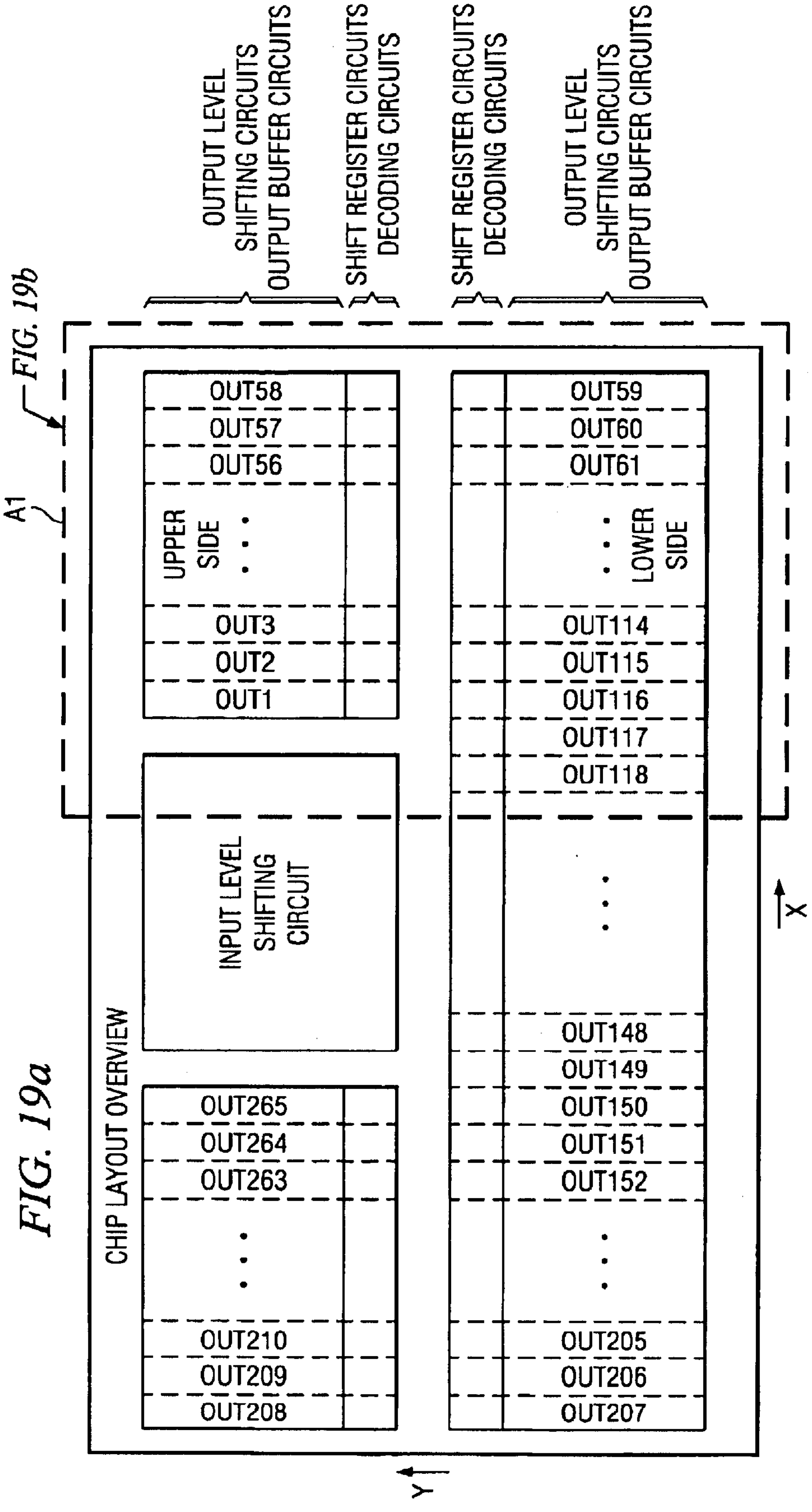
FIG. 19 is a diagram depicting a layout example of the TFT gate drive circuit shown in FIG. 15.
Figure 19B:
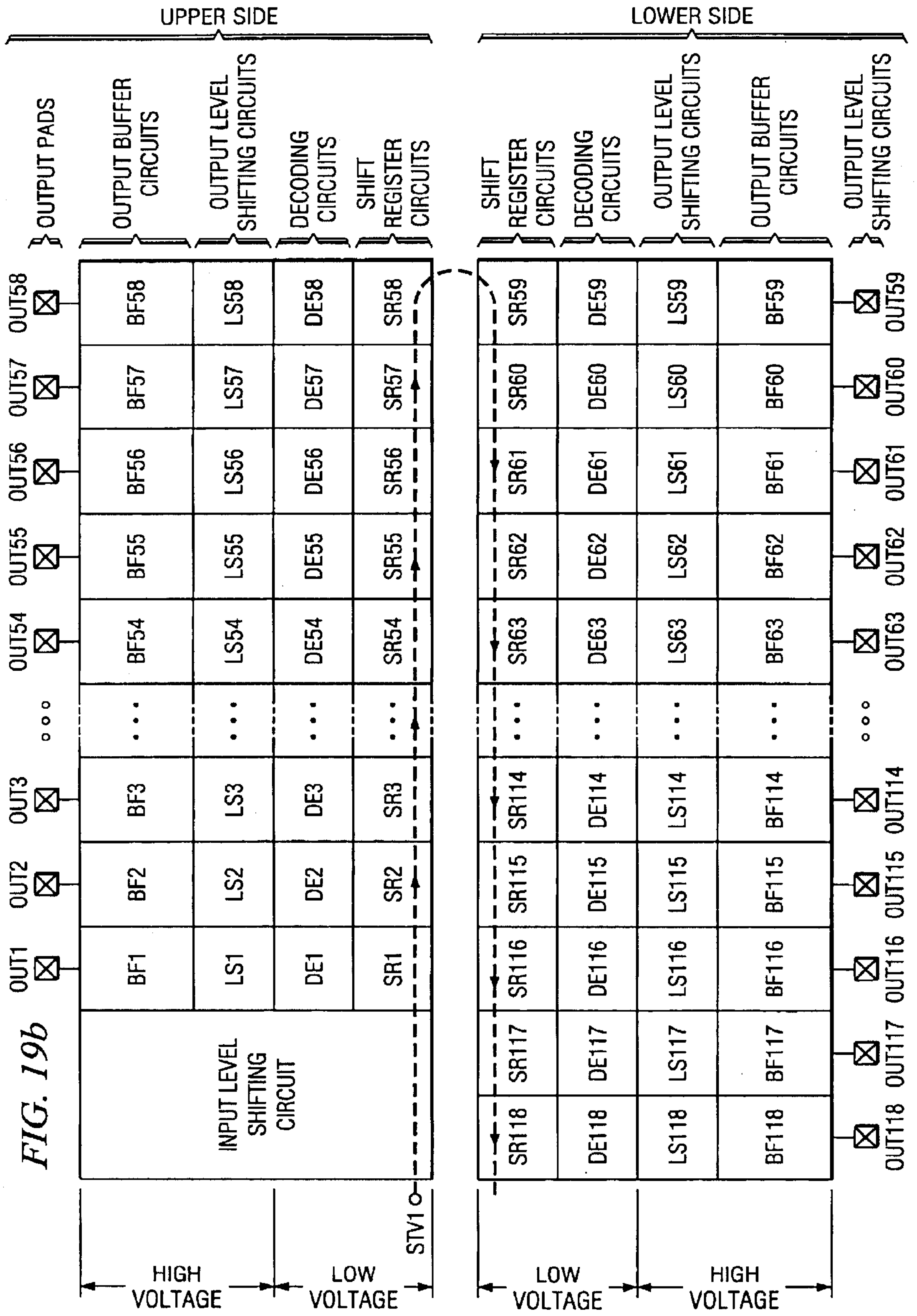

A TFT gate drive circuit with two voltage level outputs does not need to have any decoding circuits because only two voltage levels (a high voltage VCOM and a low voltage VL) are outputted as the voltage levels of gate line drive signals. An appropriate layout can therefore be obtained by removing the decoding circuits from the layout of the TFT gate drive circuit with three voltage levels in FIG. 19, as shown in FIG. 9.

Figure 10:
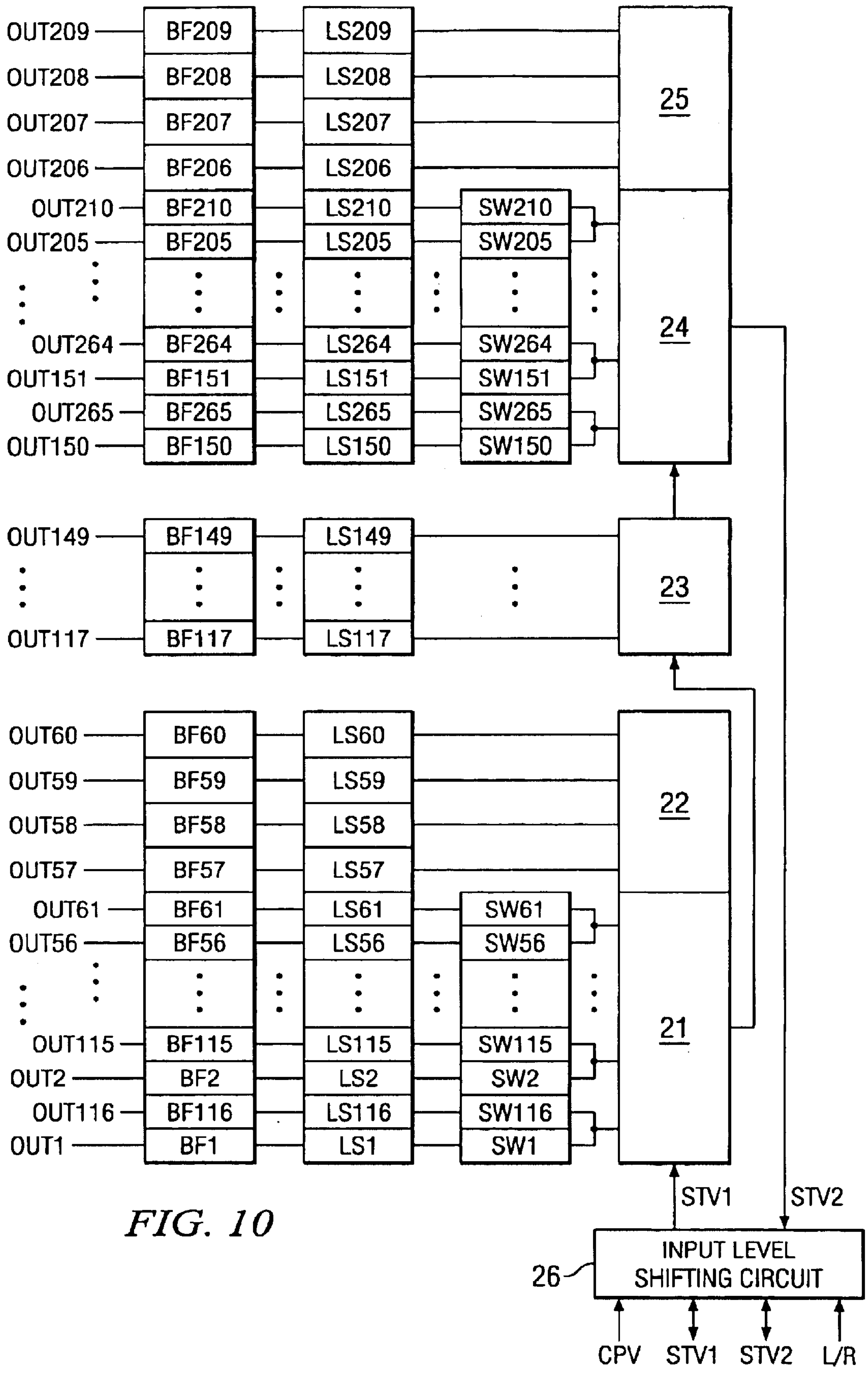
FIG. 10 is a schematic block diagram depicting a structural example of the TFT gate drive circuit pertaining to the fourth embodiment of the present invention.

FIG. 10 is a schematic block diagram depicting a structural example of the TFT gate drive circuit pertaining to the fourth embodiment of the present invention. The same symbols in FIGS. 1 and 10 refer to identical constituent elements A comparison of FIGS. 1 and 10 demonstrates that the TFT gate drive circuit shown in FIG. 10 can be obtained by removing the decoding circuits from the TFT gate drive circuit of FIG. 1. This dispenses with the output period of the reference voltage VEE, which occurs after the high voltage VCOM has been outputted for the duration of a horizontal scanning period in the manner shown in FIG. 17, allowing the voltage level of a gate line drive signal to stabilize at the low voltage VL following the output of the high voltage VCOM.

The TFT gate drive circuit shown in FIG. 10 generates the same shift direction selection signal SEL__SFT, upper channel block selection signal SEL__UP, and lower channel block selection signal SEL__LO as does the TFT gate drive circuit shown in FIG. 1. For this reason, the drive data obtained from the input level shifting circuit 26 are sequentially shifted through the shift register circuits 21–25 in the same sequence as in FIG. 1. In addition, the TFT gate drive circuit shown in FIG. 10 is configured such that gate line drive signals are outputted in numerical order from the output channels in the same manner as in the TFT gate drive circuit shown in FIG. 1 because the only difference between the two circuits is that while the shift register circuits 21 and 24 of the TFT gate drive circuit shown in FIG. 1 are such that an output voltage level is selected from the output data of shift register circuits in accordance with two-bit data generated by a decoding circuit, the TFT gate drive circuit shown in FIG. 10 is such the output voltage level is selected in accordance with the one-bit data generated provided by the shift register circuits. The gate line drive signals thus outputted can have only two voltage levels: a high voltage VCOM and a low voltage VL.

Figure 11:
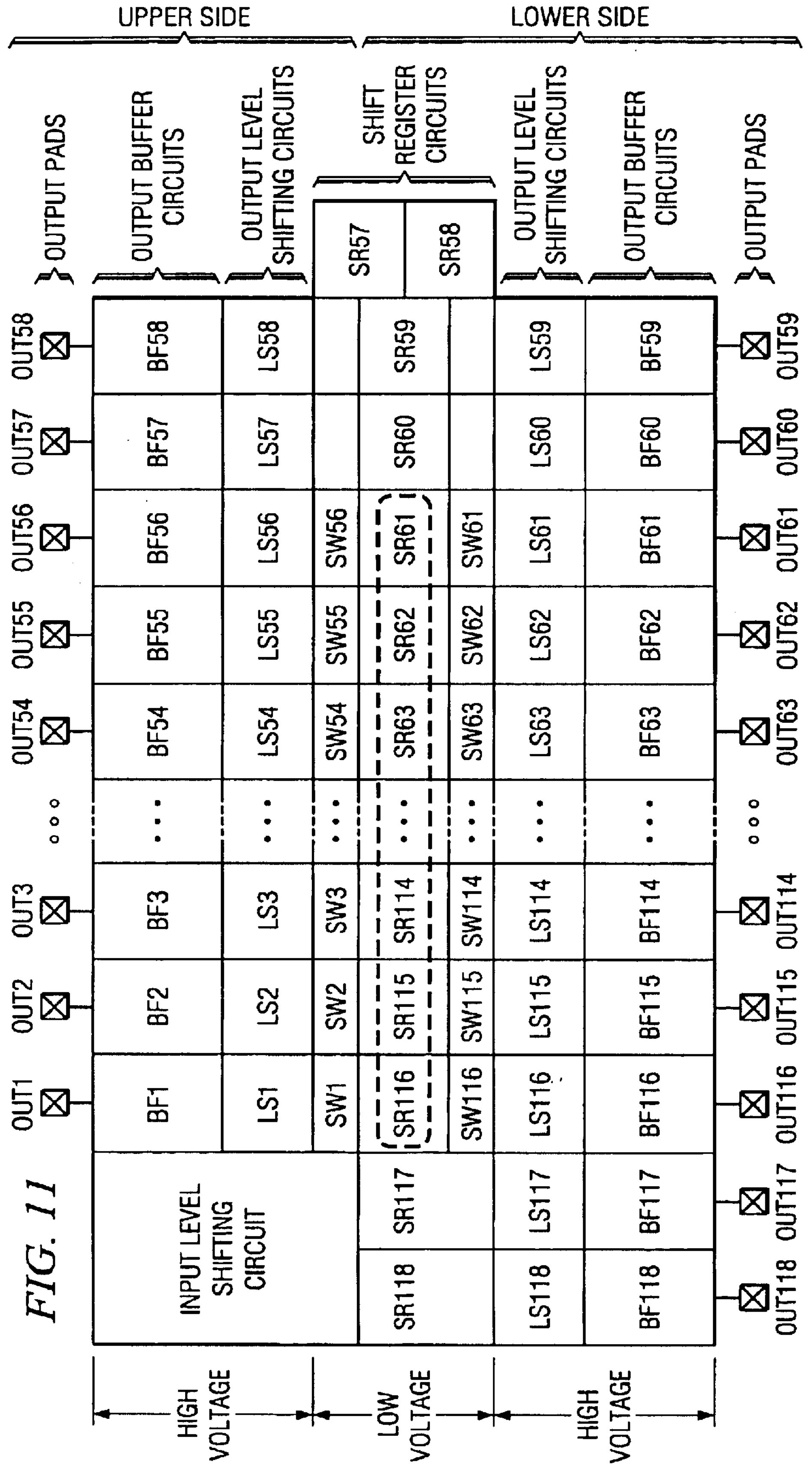
FIG. 11 is a diagram depicting a layout example of the TFT gate drive circuit shown in FIG. 10.

FIG. 11 is a diagram depicting a layout example of the TFT gate drive circuit shown in FIG. 10.

A comparison of FIGS. 9 and 11 demonstrates that the shift register circuits of the TFT gate drive circuit provided with two voltage level outputs and shown in FIG. 10 are shared by circuit blocks associated with the different output channels of upper and lower areas, allowing the number of shift register circuits (and hence the chip area) to be reduced in comparison with the conventional TFT gate drive circuit shown in FIG. 9, where the shift register circuits are provided separately in the upper and lower areas.

Fifth Embodiment

A fifth embodiment of the present invention will now be described with reference to FIGS. 12 and 13.

Figure 12:
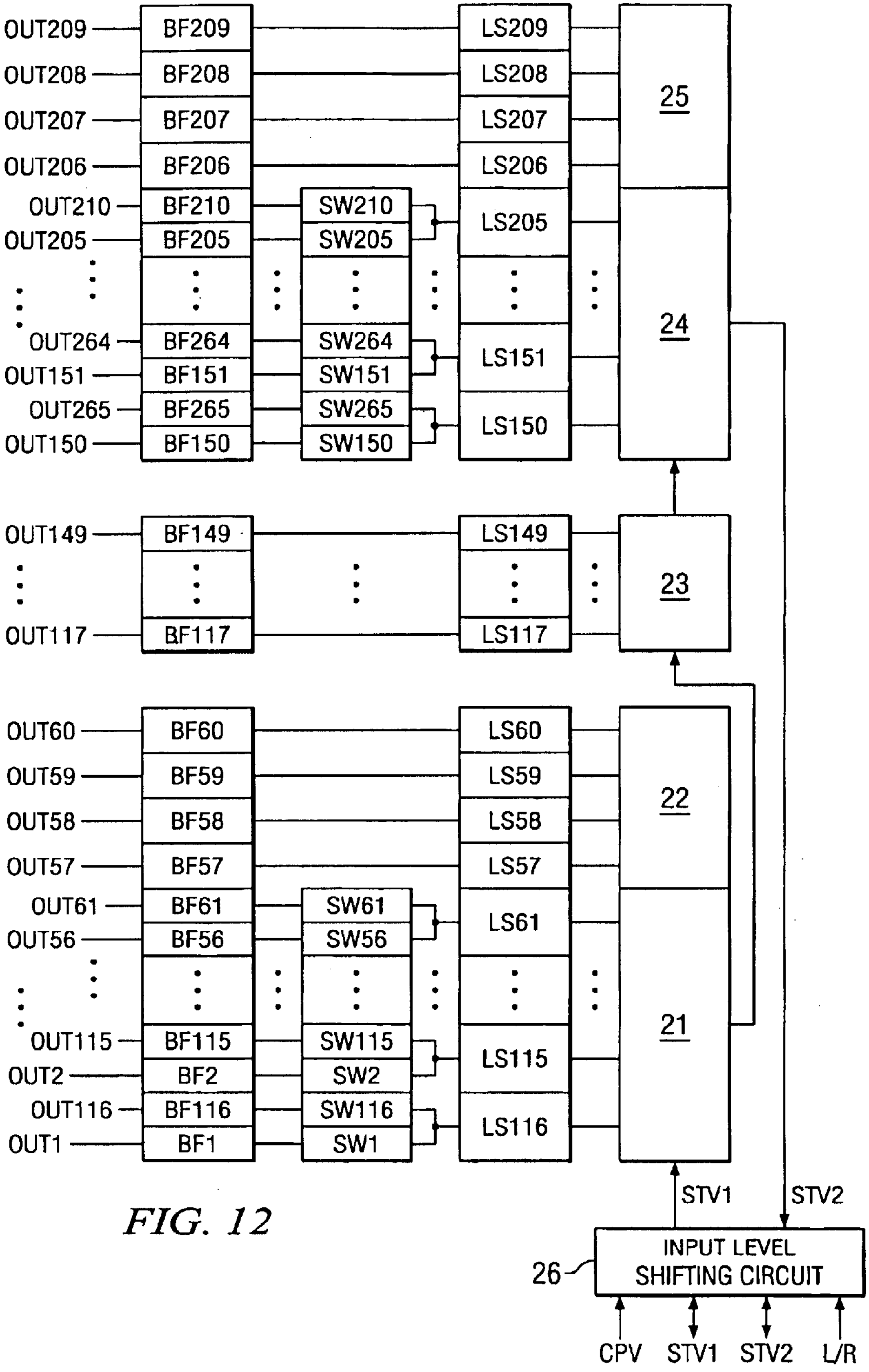
FIG. 12 is a schematic block diagram depicting a structural example of the TFT gate drive circuit pertaining to the fifth embodiment of the present invention.

The TFT gate drive circuit shown in FIG. 12 is the same TFT gate drive circuit with two voltage level outputs as the one shown in FIG. 10 except that while the TFT gate drive circuit shown in FIG. 10 is configured such that shift register circuits alone are shared, the TFT gate drive circuit shown in FIG. 12 is configured such that output level shifting circuits are shared in addition to the shift register circuits.

FIG. 12 is a schematic block diagram depicting a structural example of the TFT gate drive circuit pertaining to the fifth embodiment of the present invention, and the same symbols in FIGS. 7 and 12 refer to identical constituent elements.

A comparison of FIGS. 7 and 12 demonstrates that the TFT gate drive circuit shown in FIG. 12 can be obtained by removing the decoding circuits from the TFT gate drive circuit of FIG. 7, whereby the voltage level of the gate line drive signal thus outputted can assume only two levels: a high voltage VCOM and a low voltage VL.

The TFT gate drive circuit shown in FIG. 12 generates the same shift direction selection signal SEL__SFT, upper channel block selection signal SEL__UP, and lower channel block selection signal SEL__LO as does the TFT gate drive circuit shown in FIG. 7, so the drive data obtained from the input level shifting circuit 26 are sequentially shifted through the shift register circuits 21-25 in the same sequence as in FIG. 7. In addition, the TFT gate drive circuit shown in FIG. 12 is configured such that gate line drive signals are outputted in numerical order from the output channels in the same manner as in the TFT gate drive circuit shown in FIG. 7 because the only difference between the two circuits is that while the shift register circuits 21 and 24 of the TFT gate drive circuit shown in FIG. 7 are such that an output voltage level is selected from the output data of shift register circuits in accordance with two-bit data generated by a decoding circuit, the TFT gate drive circuit shown in FIG. 12 is such the output voltage level is selected in accordance with the one-bit output data presented by the shift register circuits.

Figure 13:
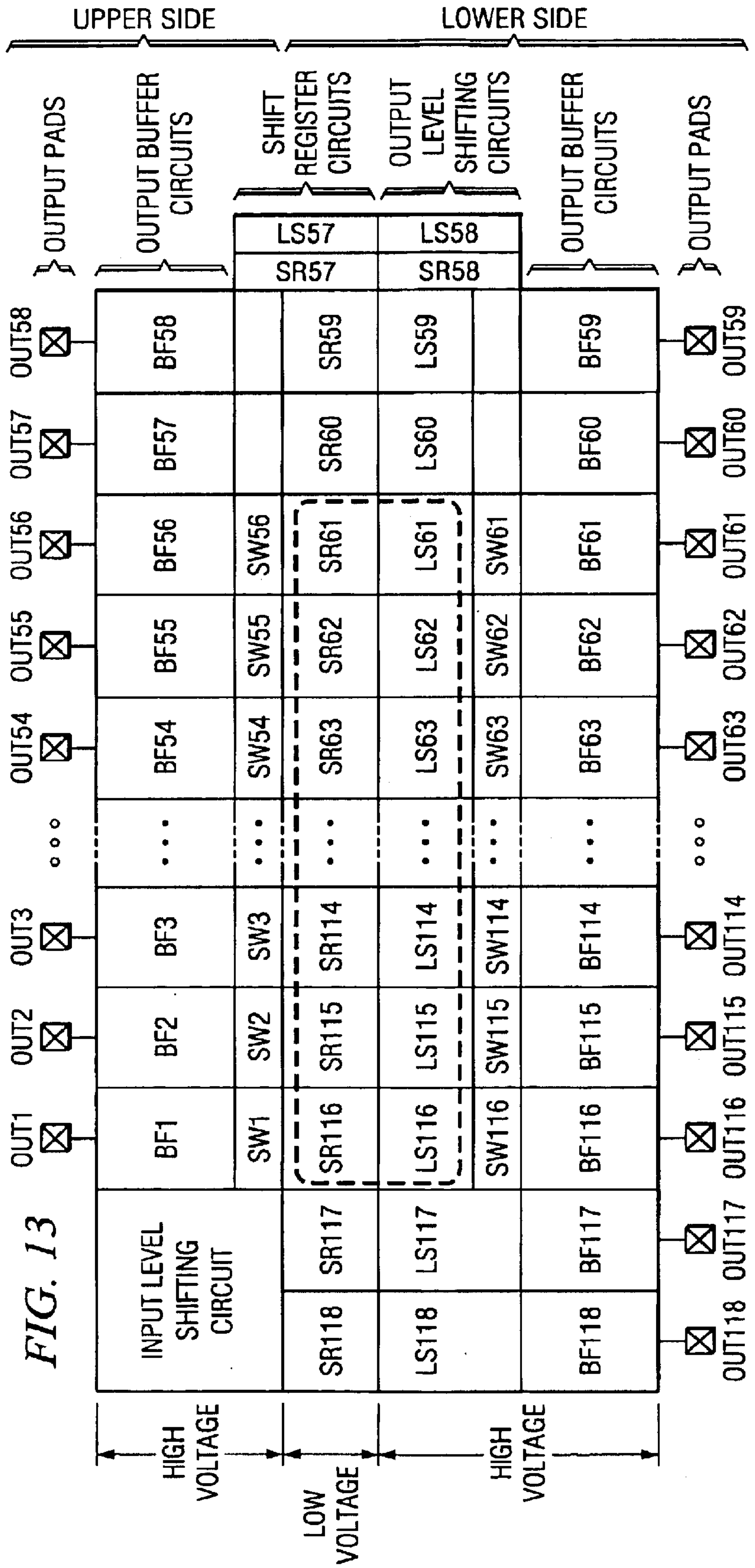
FIG. 13 is a diagram depicting a layout example of the TFT gate drive circuit shown in FIG. 12.
Figure 14:
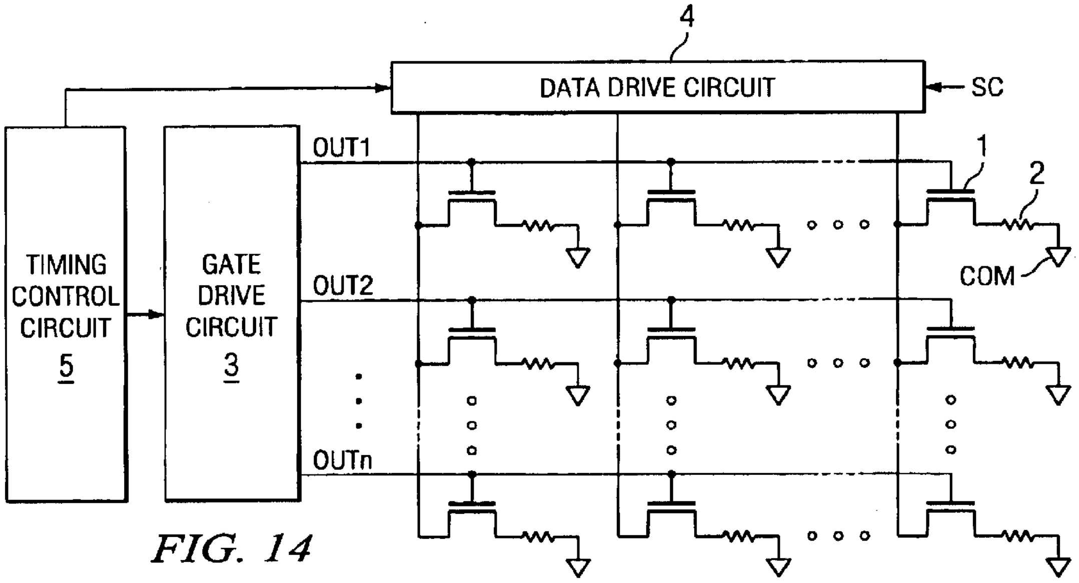
FIG. 14 is a schematic block diagram depicting the display of a common TFT liquid-crystal device.

FIG. 13 is a diagram depicting a layout example of the TFT gate drive circuit shown in FIG. 12.

A comparison of FIGS. 9 and 13 demonstrates that the shift register circuits and output level shifting circuits of the TFT gate drive circuit provided with two voltage level outputs and shown in FIG. 10 are shared by circuit blocks associated with different output channels of upper and lower areas, allowing the number of shift register circuits (and hence the chip area) to be reduced in comparison with the conventional TFT gate drive circuit shown in FIG. 9.

It can be seen from the above description that the TFT gate drive circuits pertaining to the embodiments of the present invention operate such that the drive data input of a TFT gate drive circuit in which a plurality of gate lines are sequentially energized is sequentially shifted from the top bits to the end bits of the shift register circuits 21-25, and the shifting direction of the bidirectional shift register circuits 21 and 24 included in the shift register circuits is inverted in accordance with the number of shifts undergone the drive data from the top bits. A single output channel is selected by a switching circuit in accordance with the number of shifts from two specific output channels associated with the bits of the shift register circuits 21 and 24, and a gate line drive signal whose voltage level corresponds to the positional relation between the corresponding bits and the bit positions of drive data is outputted by an output buffer circuit from the selected output channel. Specifically, a gate line drive signal with a high voltage VCOM is outputted from the output channel selected in accordance with these bits when the drive data are shifted to the corresponding bit. A gate line drive signal with a reference voltage VL is outputted from the other (unselected) output channel. In addition, a gate line drive signal whose voltage level corresponds to the positional relation between the corresponding bits and the bit positions of the aforementioned drive data is outputted from the output channels associated with the bits of the shift register circuits 22, 23, and 25. A comparatively simple method can therefore be used to permit shift register circuits or other circuits (decoding circuits, output level shifting circuits) to be shared by a plurality of output channels while preserving the function whereby gate lines are sequentially energized by a specific voltage level in the same manner as in the past, making it possible to markedly reduce the number of circuits in comparison with that required by the prior art. The chips can thereby be made much smaller, manufacturing costs can be reduced, and more-compact chips can be fabricated.

The present invention is not limited by the embodiments described above.

For example, the above embodiments were described with reference to TFT gate drive circuits, but the present invention is not limited to these circuits alone and can be adapted to any other drive circuit in which a plurality of output lines are sequentially energized with the aid of shift registers.

In addition, the data shifted as drive data through shift register circuits are not limited to one-bit data such as that shown in FIG. 3 and may be in the form of multiple-bit data.

Although the above embodiments were described with reference to cases in which drive data made a single round trip through shared shift register circuits 21 and 24, the present invention is not limited to this option alone and may involve drive data flowing back and forth an arbitrary number of times through specific bidirectional registers. In this case, any appropriate number of output channels can be selected by the switching circuits.

In addition, the number of output channels, the number of output voltage levels, the layouts used, the manner in which the shift register circuits or switching circuits are controlled, and other features described above merely illustrate possible embodiments and represent specific examples of these embodiments without limiting the present invention in any way.

Effects of the Invention

The present invention allows the circuit size of a drive circuit to be reduced more efficiently than in the past. The same can be achieved with respect to the surface area of the chip.

What is claimed is:

1. A drive circuit for sequentially supplying a drive voltage to a plurality of output lines, said drive circuit comprising:

a first shift register provided with m (where m is an integer of 2 or greater) serially connected bit circuits and designed to shift a drive data input away from the first bit circuit toward the m-th bit circuit on the basis of a clock signal in a first state, and to shift the drive data input away from the m-th bit circuit toward the first bit circuit on the basis of a clock signal in a second state;

a first output circuit with m output units that correspond to the bit circuits of the first shift register and that present a first output line with a drive voltage based on data from the bit circuits in the first state; and a second output circuit with m output units that correspond to the bit circuits of the first shift register and that present a second output line with a drive voltage based on data from the bit circuits in the second state.

2. The drive circuit according to claim 1, wherein each output unit of the first output circuit presents the first output line with a first drive voltage as a nonselective drive voltage in the second state, and each output unit of the second output circuit presents the second output line with the first drive voltage as a nonselective drive voltage in the first state.

3. The drive circuit according to claim 2, comprising:

a second shift register provided with n (where n is an integer of 2 or greater) serially connected bit circuits and configured such that the data fed to the first bit circuit from the m-th bit circuit of the first shift register are shifted on the basis of a clock signal and fed from the n-th bit circuit to the m-th bit circuit of the first shift register; and a third output circuit with n output units that correspond to the bit circuits of the second shift register and that present a third output line with a drive voltage based on the data from the bit circuits.

4. The drive circuit according to claim 2, comprising:

a decoding circuit with m decoders that correspond to the bit circuits of the first shift register and that present the output unit of the first output circuit or the output unit of the second output circuit with a decoding signal for selecting a drive voltage on the basis of the data from the bit circuits.

5. The drive circuit according to claim 4, wherein each output unit of the first or second output circuit presents the first or second output line with a drive voltage selected from the first drive voltage as a nonselective drive voltage based on the decoding signal, a second drive voltage as a selective drive voltage, and a third drive voltage as a nonselective drive voltage.

* * * * *